(12) United States Patent
Haraguchi et al.

(10) Patent No.: US 6,779,139 B2
(45) Date of Patent: Aug. 17, 2004

(54) CIRCUIT FOR REDUCING TEST TIME AND SEMICONDUCTOR MEMORY DEVICE INCLUDING THE CIRCUIT

(75) Inventors: Masaru Haraguchi, Hyogo (JP); Katsumi Dosaka, Hyogo (JP); Tetsushi Tanizaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 479 days.

(21) Appl. No.: 09/845,494

(22) Filed: May 1, 2001

(65) Prior Publication Data

US 2002/0056061 A1 May 9, 2002

(30) Foreign Application Priority Data

Nov. 6, 2000 (JP) ........................................ 2000-337612

(51) Int. Cl.[7] .............................................. G11C 29/00
(52) U.S. Cl. ....................................... 714/718; 714/736
(58) Field of Search ................................ 714/718, 733, 714/734, 736; 265/201

(56) References Cited

U.S. PATENT DOCUMENTS 5,457,696 A * 10/1995 Mori
5,894,213 A * 4/1999 Nakamura ................ 340/146.2
5,912,851 A * 6/1999 Matsuoka .................... 365/201
6,009,028 A * 12/1999 Akiyama ..................... 365/201

FOREIGN PATENT DOCUMENTS

JP          3-231541        10/1991
JP         11-265597         9/1999

* cited by examiner

Primary Examiner—Phung M. Chung
(74) Attorney, Agent, or Firm—McDermott Will & Emery LLP

(57) ABSTRACT

A semiconductor memory device includes: a determination section; an expected value control section; and an accumulation section. The determination section determines coincidence/non-coincidence between input data and an expected value. The expected value control section catches a read expected value in a read operation only. The accumulation section catches a determination result according to an accumulation-transmission signal. When the accumulation-transmission signal is in a transmission state, a determination result is caught, while when the accumulation-transmission signal enters an accumulation state, the next determination result is caught in a case of coincidence determination and once a non-coincidence determination result is caught, thereafter the non-coincidence determination result continues to be held.

25 Claims, 25 Drawing Sheets

CIRCUIT FOR REDUCING TEST TIME AND SEMICONDUCTOR MEMORY DEVICE INCLUDING THE CIRCUIT

BACKGROUND OF THE INVENTION

1. Field of the Invention

The present invention relates to a test facilitating circuit and a semiconductor memory device including the circuit, and particularly, to a configuration for testing whether or not data coincides with an expected value.

2. Description of the Background Art

A memory combined with a logic having a wide I/O (input/output) bus has heretofore available. Such a logic combined memory is provided with a circuit for testing a memory.

To be concrete, the testing includes a saving test detecting a defective memory cell and a functional test testing a memory after a defective memory cell is replaced with a redundant memory cell.

In the saving test, it is specified where a failure has arisen. In the functional test, it is determined that a chip under test is defective if any of read data has a fail.

In the mean time, since a memory combined with a logic having a wide I/O bus has a limitation on the number of output pins for testing, a necessity arises that read data read out from memory cells or determination results (pass/fail) each showing coincidence/non-coincidence between read data and an expected value are divided into groups for outputting in times.

In a functional test following a saving test, since determination results can be degenerated (without specifying a failure) for outputting, using means such as a multibit test, a test time can be reduced in spite of presence of the above described limitation.

In a saving test, however, since it is necessary to specify a place of a failure, no means is adopted to degenerate and output a determination result.

More concrete description will be given of a saving test for a prior art semiconductor memory device (a logic combined memory) using FIGS. 25 and 26. Note that FIGS. 25 and 26 use the same abscissa representing a time scale with the same time point t1 thereon. An I/O bus width for use in simultaneous outputting is set to 256 (a 256 I/O configuration). Data input/output pins D/Q each selected as one from every 32 I/O adjacent to each other. Therefore, 8 data I/O pins are assigned to test output pins for the 256 I/O.

It is assumed that word lines have a branched word line configuration and one main word line MWL branches out into 4 subword lines SWL. Furthermore, one of 16 columns (16 sense amplifiers) is connected to one data I/O bus pair according to a column select signal. Moreover, spare substitution in a row direction is performed with one MWL as a unit, while spare substitution in a column direction is performed with one I/O as a unit. In the substitution, all of memory cells connected to a prescribed region (of one MWL and one I/O) are replaced at a time.

Commands specifying internal operations (ACT, NOP, Read and PRE) are each issued at each rise of a clock signal CLK and addresses for word line selection and column selection are inputted at the rise of the clock signal CLK on each of the issuance. CSLi indicates a column select signal and Dk indicates read data.

For example, a subword line SWL0 of a main word line MWL0 is selected and data is successively transmitted onto an I/O bus I/O0 according to column select signals CSL0 to CSL15. Data is outputted from a data I/O output pin DQ<0> connected to the bus. A similar operation is repeated for 32 sets (corresponding to I/O0 to I/O31).

Subsequent to this, data on memory cells connected to the subword lines SWL1, SWL2 and SWL3 is successively read out.

In such a fashion, in the prior art saving test, it is necessary that data is written into a memory array block at a time via 256 I/O simultaneously inputtable and thereafter, the data written thereinto is all read out, or determination results showing coincidence/non-coincidence between expected values and the read data are divided into 32 groups (=256/8) to output.

Accordingly, in the above example, a period required for reading out data of the subword line SWL0 is (ACT+NOP+16 Read×32+NOP+PRE+NOP)=517 cycles. Hence, in order to read out all the data connected to one MWL and one I/O in the 256 I/O configuration, a time length of 517×4=2068 cycles is required.

On the other hand, in a functional test, determination results can be degenerated and outputted as described above. However, for example, when functional tests for many chips are performed in parallel while the chips are inserted in a burn-in board as in Testing Burn-In, it is required that test results are successively loaded onto a bus on the board. Furthermore, when a test is performed on a chip on which PLL and the like circuits are mounted using a low speed tester, a stroboscope for determination can not work properly even if test results are outputted to outside at high speed using PLL or the like, due to use of the low speed tester.

SUMMARY OF THE INVENTION

It is accordingly an object of the present invention to provide a test facilitating circuit capable of testing a data value in a short time with ease.

A test facilitating circuit according to an aspect of the present invention includes a non-coincidence holding circuit receiving a determination result showing coincidence/non-coincidence between input data and an expected value and a control signal at an input thereof, wherein when the control signal shows a transmission state, the non-coincidence holding circuit catches the determination result, while when the control signal shows an accumulation state different from the transmission state, once the non-coincidence holding circuit catches the determination result showing the non-coincidence, thereafter the non-coincidence holding circuit holds the determination result showing the non-coincidence till the control signal shows the transmission state.

It is preferable that a plurality of non-coincidence holding circuits are provided and the test facilitating circuit further includes: a plurality of comparators each determining coincidence/non-coincidence between input data and an expected value. Each of the plurality of non-coincidence holding circuits receives a determination result outputted by a corresponding comparator.

Particularly, the test facilitating circuit further includes: a circuit outputting a non-coincidence result when at least one of first plural ones of the determination results is the non-coincidence; and a degeneration circuit outputting the non-coincidence result when the circuit outputs the non-coincidence result.

It is preferable that the test facilitating circuit further includes: a multibit test circuit testing whether or not all of bits of the data are in coincidence, wherein the non-coincidence holding circuit receives an output of the multibit test circuit as the determination result.

It is preferable that the test facilitating circuit further includes: a saving circuit catching the determination result outputted by the non-coincidence holding circuit when a shift signal is in a first state, while holding the determination result caught at a previous time when the shift signal is in a second state other than the first state.

Particularly, the non-coincidence holding circuit receives the shift signal as the control signal.

It is preferable that a plurality of non-coincidence holding circuits and a plurality of saving circuits including the saving circuit are provided and the test facilitating circuit further includes: a circuit outputting a non-coincidence result when at least one of the plurality of first determination results; and a degeneration circuit outputting the non-coincidence result when the circuit outputs the non-coincidence circuit.

Particularly, the test facilitating circuit further includes a counter generating a control signal or a shift signal. The test facilitating circuit further includes a circuit catching an expected value in a specified operating mode only.

According to a test facilitating circuit relating to the present invention, by providing an accumulation section accumulating coincidence/non-coincidence results between data and expected values, determination results can be accumulated in arbitrary cycles. Particularly, since a coincidence determination is caught, and once determination results in non-coincidence, thereafter a non-coincidence result can be held; therefore, a test time can be reduced when determination results are outputted for a great amount of data.

Furthermore, by supplying a value obtained by compiling a plurality of determination results to such an accumulation section, data can be determined as a unit.

Moreover, by providing a shift section, accumulation of determination results and outputting of the determination results can be superimposed on each other in timing. As a result, the number of cycles required for a test is reduced.

Still furthermore, by catching an expected value in a specified operating mode only, a pin used for a purpose other than inputting the expected value is used as a pin inputting the expected value. Yet furthermore, a wrong determination can be prevented.

Still moreover, the present invention provides a semiconductor memory device capable of testing a memory in a short time with ease.

A semiconductor memory device of the present invention includes: a memory cell array having a plurality of memory cells, a plurality of word lines and a plurality of bit lines; a read circuit reading out data from the memory cell array; and a test facilitating circuit including a non-coincidence holding circuit receiving a determination result showing coincidence/non-coincidence between read data and an expected value and a control signal at an input thereof. When the control signal shows a transmission state, the non-coincidence holding circuit catches the determination result, while when the control signal shows an accumulation state different from the transmission state, once the non-coincidence holding circuit catches the determination result showing the non-coincidence, thereafter the non-coincidence holding circuit holds the determination result showing the non-coincidence till the control signal shows the transmission state.

It is preferable that a plurality of non-coincidence holding circuits are provided and the test facilitating circuit further includes: a plurality of comparators each determining coincidence/non-coincidence between read data and an expected value. Each of the plurality of non-coincidence holding circuits receives a determination result outputted by a corresponding comparator.

Particularly, the test facilitating circuit further includes: a circuit outputting the non-coincidence result when at least one of first plural ones of said determination results is the non-coincidence and at least one of the plurality of non-coincidence holding circuits provided outputs the non-coincidence result when the circuit outputs the non-coincidence result.

It is preferable that the test facilitating circuit further includes: a multibit test circuit testing whether or not all of bits of the read data is in coincidence, wherein the non-coincidence holding circuit receives an output of the multibit test circuit as a determination result.

It is preferable that when a shift signal is in a first state, the test facilitating circuit catches a determination result outputted by the non-coincidence holding circuit, while when the shift signal in a state other than the first state, further including a saving circuit holding a caught determination result. Especially, the non-coincidence holding circuit receives the shift signal as the control signal.

Particularly, a plurality of non-coincidence circuits and a plurality of saving circuits are provided and the test facilitating circuit further includes: a circuit outputting a non-coincidence result when at least one of first plural ones of the determination results and at least one of the plurality of saving circuits outputs the non-coincidence result when the circuit outputs the non-coincidence result.

It is preferable that the semiconductor memory device further includes a counter generating a control signal or a shift signal.

It is preferable that a burst counter for performing a burst operation or a refresh counter for performing a refresh operation is used as the counter.

Furthermore, the test facilitating circuit further includes a circuit catching an expected value in a specified operating mode only.

It is preferable that the semiconductor memory device further includes: a redundancy circuit for saving a defect of the memory cell array; and a redundancy test facilitating circuit having the same configuration as the test facilitating circuit provided for data read out from the redundancy circuit.

According to a semiconductor memory device relating to the present invention, by providing an accumulation section accumulating coincidence/non-coincidence results between data and expected values, determination results can be accumulated in arbitrary cycles (as a substitution unit or at a chip level). Particularly, since a coincidence determination is caught, and once determination results in non-coincidence, thereafter the non-coincidence result can be held, a test time can be reduced when determination results for a great amount of data are outputted to limited output pins.

Furthermore, operations of the accumulation section and the shift section can be controlled using a burst counter or refreshing counter available on the market. Thereby, increase in circuit scale can be prevented.

Still furthermore, a similar test can be performed on a redundancy configuration.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given of configurations of embodiments of the present invention below with reference to the accompanying drawings. In the figures, the same or corresponding constituents are attached with the same symbols and description thereof is omitted.

First Embodiment

Figure 1:
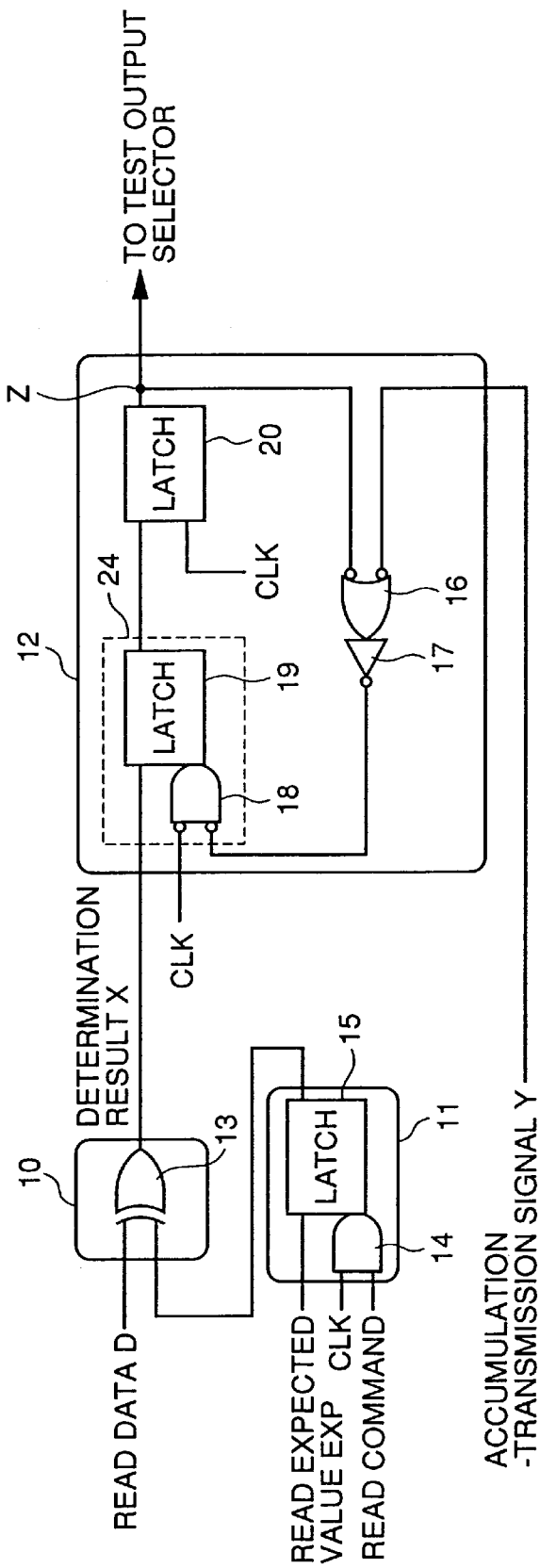
FIG. 1 is a diagram for describing a configuration of a test circuit block of a semiconductor memory device according to a first embodiment.

Description will be given of a configuration of a test circuit block of a semiconductor memory device 1000 according to the first embodiment using FIG. 1. Referring to FIG. 1, the test circuit block according to the first embodiment includes: a determination section 10; an expected value control section 11; and an accumulation section 12. The determination section 10 and the accumulation section 12 are arranged on a test circuit described later, which is provided to each data output bus (hereinafter referred to as I/O bus). The expected value control section 11 can be used commonly by a plurality of test circuits.

The determination section 10 includes a logic circuit (Exclusive-OR) 13 and determines coincidence/non-coincidence between read data received from a read data bus, described later, and a read expected value EXP to output a determination result X. The determination result X is at L level when being in coincidence, while being at H level when being in non-coincidence.

The expected value control section 11 includes a latch circuit with Enable signal having a logic circuit 14 and a latch circuit 15, and performs control for catching a read expected value EXP in a read operation only. The logic circuit 14 receives a clock signal CLK and a read command issued in a read operation to output a signal of H level when the read command goes to H level while the clock signal CLK is at H level. The latch circuit 15 latches the read expected value when an output of the logic circuit 14 is at H level. The read expected value EXP latched by the latch circuit 15 is inputted to the determination section 10.

By providing such an expected value control section 11, a wrong determination operation is prevented and furthermore, to input a read expected value EXP becomes possible using another control I/O pin.

The accumulation section 12 includes: a logic circuit 16 receiving a signal ZO of an output node ZO and an accumulation-transmission signal Y; an inverter 17 inverting an output of the logic circuit 16; a latch circuit with Enable signal 24 including a logic circuit 18 and a latch circuit 19; and a latch circuit 20 latching an output of the latch circuit with Enable signal 24.

A signal of H level is outputted from the inverter 17 in a case where the signal ZO is at H level (a fail state) and the accumulation-transmission signal Y is at H level, while outputting a signal of L level in the other cases.

Figure 23:
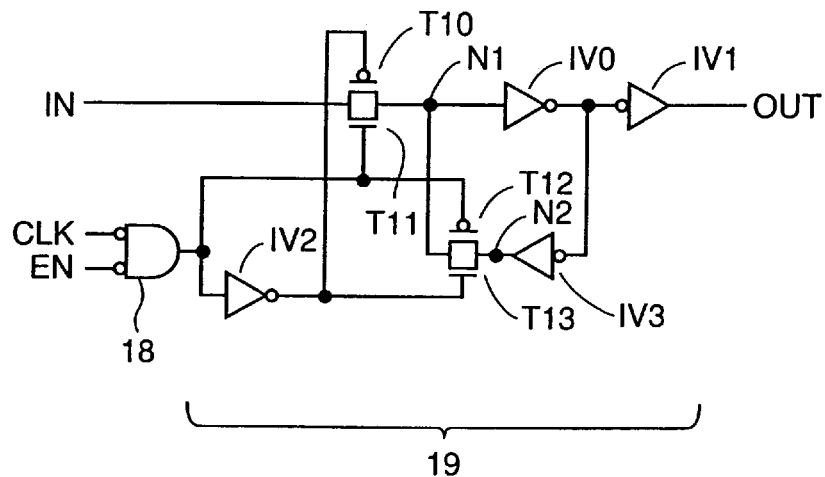
FIG. 23 is a circuit diagram representing an example concrete configuration of a latch circuit with Enable signal 24.

Basically, when the clock signal CLK is at L level, the latch circuit with Enable signal 24 transmits a determination result therethrough, while when the clock signal CLK is at H level, holding a determination result. On the other hand, when an output of the inverter 17 is at H level, the latch circuit with Enable signal 24 does not transmit the next determination result therethrough and performs an accumulation operation, even if the clock signal CLK is at L level. An example concrete configuration of the latch circuit with Enable signal 24 is shown in FIG. 23. The latch circuit with Enable signal 24 shown in FIG. 23 includes: a logic circuit 18 receiving the clock signal CLK and an enable signal EN; and a latch circuit 19 having transistors T10 to T13 and inverters IV0 to IV3.

The transistors T10 and T12 are both PMOS transistors and the transistors T11 and T13 both NMOS transistors. The inverter IV2 inverts an output of the logic circuit 18. The inverter IV3 inverts an output of the inverter IV0.

The transistors T10 and T11 are connected in parallel between an input node IN and an input node N1 of the inverter IV0. The gate of the transistor T10 receives an output of the inverter IV2 and the gate of the transistor T11 receives an output of the logic circuit 18.

The transistors T12 and T13 are connected in parallel between the node N1 and an output node N2 of the inverter IV3. The gate of the transistor T12 receives an output of the logic circuit 18 and the gate of the transistor T13 receives an output of the inverter IV2.

The inverter IV1 inverts an output of the inverter IV0 to output the inverted output to an output node OUT.

When the clock signal CLK and the enable signal EN are both at L level, a signal of an input node IN is transmitted through to the output node OUT, while when the clock signal CLK or the enable signal EN is at H level, internal data is latched and the signal of the input node IN is not transmitted through to the output OUT.

Referring to FIG. 1, the logic circuit 18 receives the clock signal CLK and an output (enable signal) of the inverter 17 to output a signal of H level when an output of the inverter 17 goes to L level while the clock signal CLK is at L level. When an output of the logic circuit 18 is at H level, the latch circuit 19 transmits a determination result X therethrough while when at L level, latching the determination result X.

The latch circuit 20 catches a signal latched in the latch circuit 19. A signal caught into the latch circuit 20 is outputted onto the node Z0. The signal Z0 of the node Z0 is transmitted to a test output selector described later.

Figure 24:
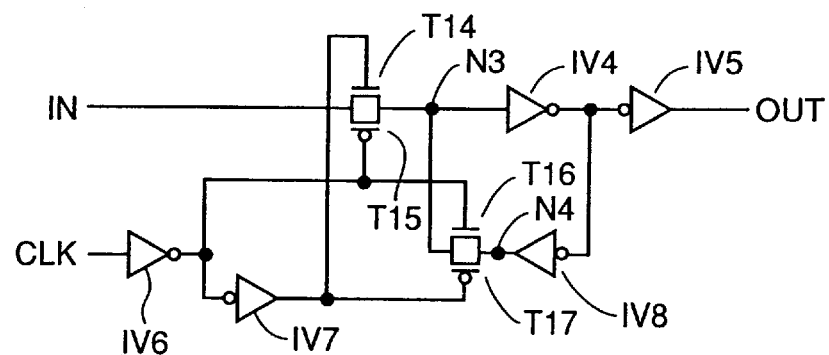
FIG. 24 is a circuit diagram representing an example concrete configuration of a latch circuit 20.
Figure 25:
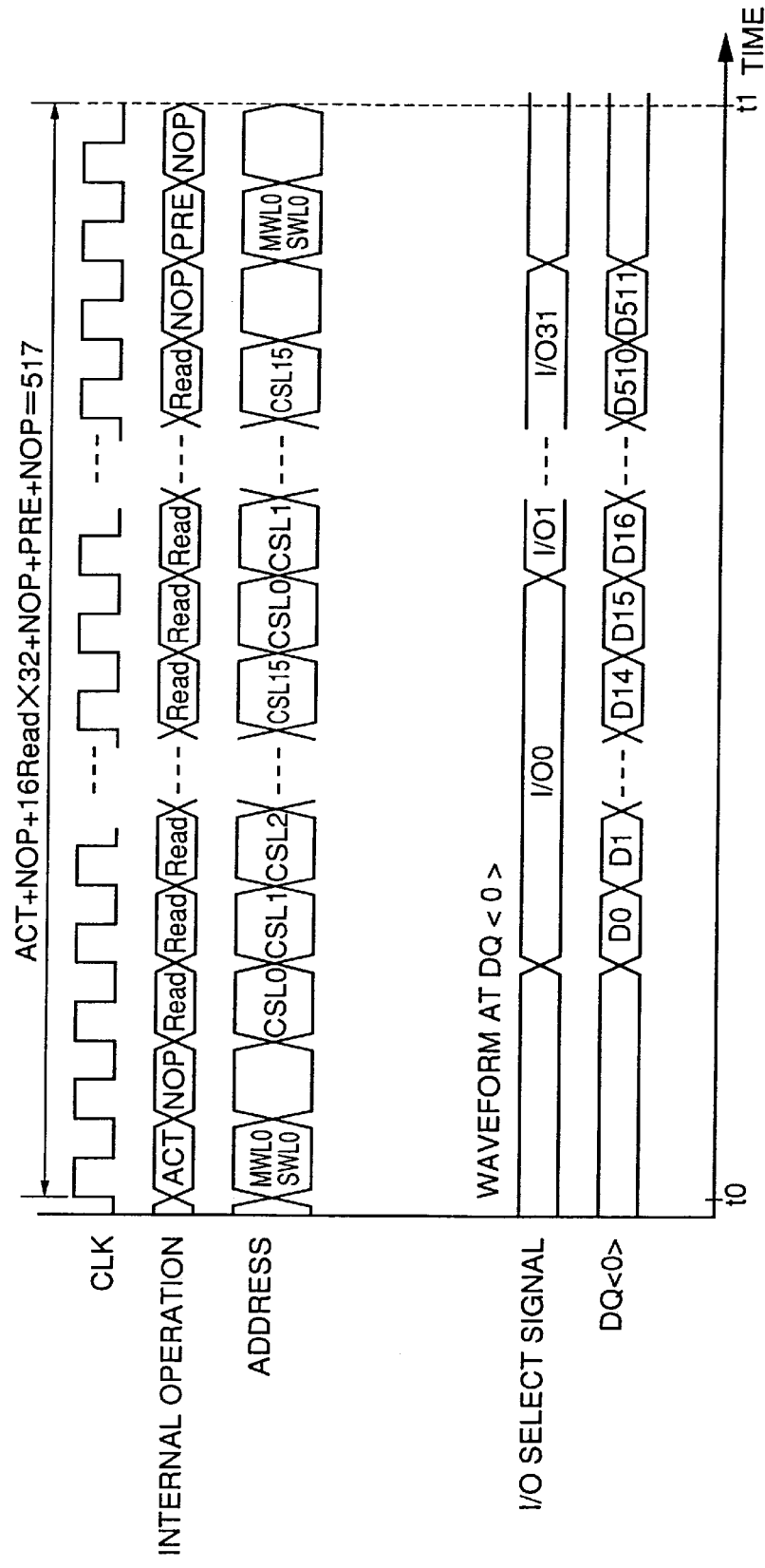
FIGS. 25 and 26 are timing charts for describing a saving test on a prior art semiconductor memory device.
Figure 26:
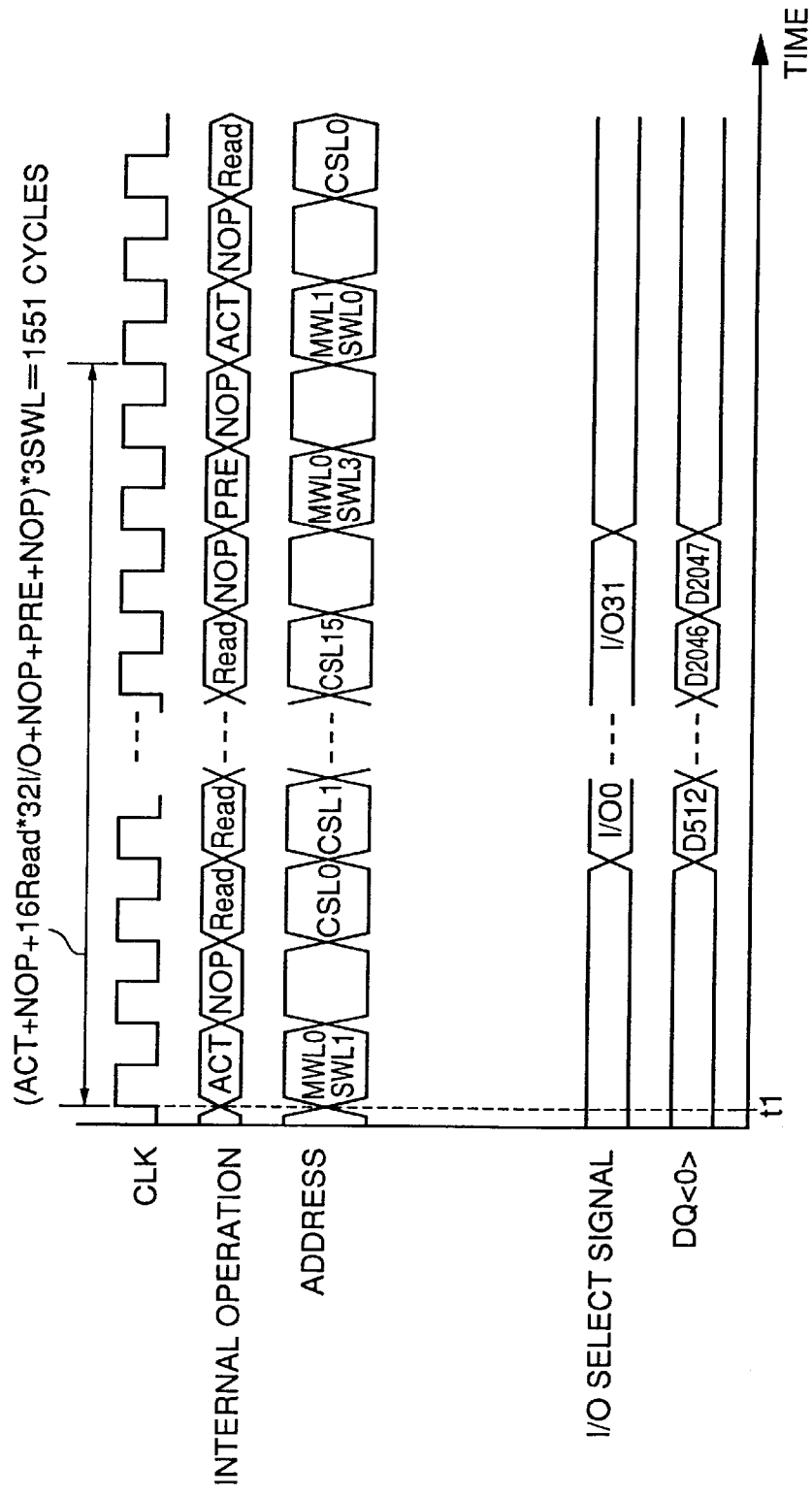

An example concrete configuration of the latch circuit 20 is shown in FIG. 24. The latch circuit 20 shown in FIG. 20 includes transistors T14 to T17 and inverters IV4 to IV8. The transistors T15 and T17 are both PMOS transistors and the transistors T14 and T16 are both NMOS transistors.

The inverter IV6 inverts the clock signal CLK. The inverter IV7 inverts an output of the inverter IV6. The inverter IV8 inverts an output of the inverter IV4.

The transistors T14 and T15 are connected in parallel between the input node N1 and an input node N3 of the inverter IV4. The gate of the transistor T14 receives an output of the inverter IV7 and the gate of the transistor T15 receives an output of the inverter IV6.

The transistors T16 and T17 are connected in parallel between the node N3 and an output node N4 of the inverter T18. The gate of the transistor T16 receives an output of the inverter IV6 and the gate of the transistor T17 receives an output of the inverter IV7.

The inverter IV5 inverts an output of the inverter IV4 to output the inverted output to the output node OUT.

When the clock signal CLK is at H level, a signal of the input node IN is transmitted through to the output node OUT, while when the clock signal is at L level, an internal data is latched and the signal of the input node IN is not transmitted through to the output node OUT.

Referring to FIG. 1, when the accumulation-transmission signal Y is at L level (a transmission state), the accumulation section 12 catches a determination result X, while when the accumulation-transmission signal Y goes to H level (an accumulation state), the accumulation section 12 catches the next determination result X in a case of coincidence determination and once the accumulation section 12 catches a non-coincidence determination results X, thereafter the accumulation section 12 continues to hold the non-coincidence determination result without transmitting the next determination result X therethrough.

Next, description will be given of an overall configuration of the semiconductor memory device 1000 according to the first embodiment. The semiconductor memory device 1000 shown in FIG. 2 includes: memory array blocks 100A and 100B having memory cells therein; an array control block 110 controlling a data read-write operation in the memory array blocks 100A and 100B; a data path block 120A having a plurality of I/O buses and for supplying and receiving data between the memory array block 100A and data input pins; a data path block 120B having a plurality of I/O buses and for supplying and receiving data between the memory array 100B and data input pins; a test circuit block 130A for testing the memory cell array block 100A; a test circuit block 130B for testing the memory cell array block 100B; and a control block 140 controlling the data path blocks 120A and 120B, and the test circuit blocks 130A and 130B.

Figure 2:
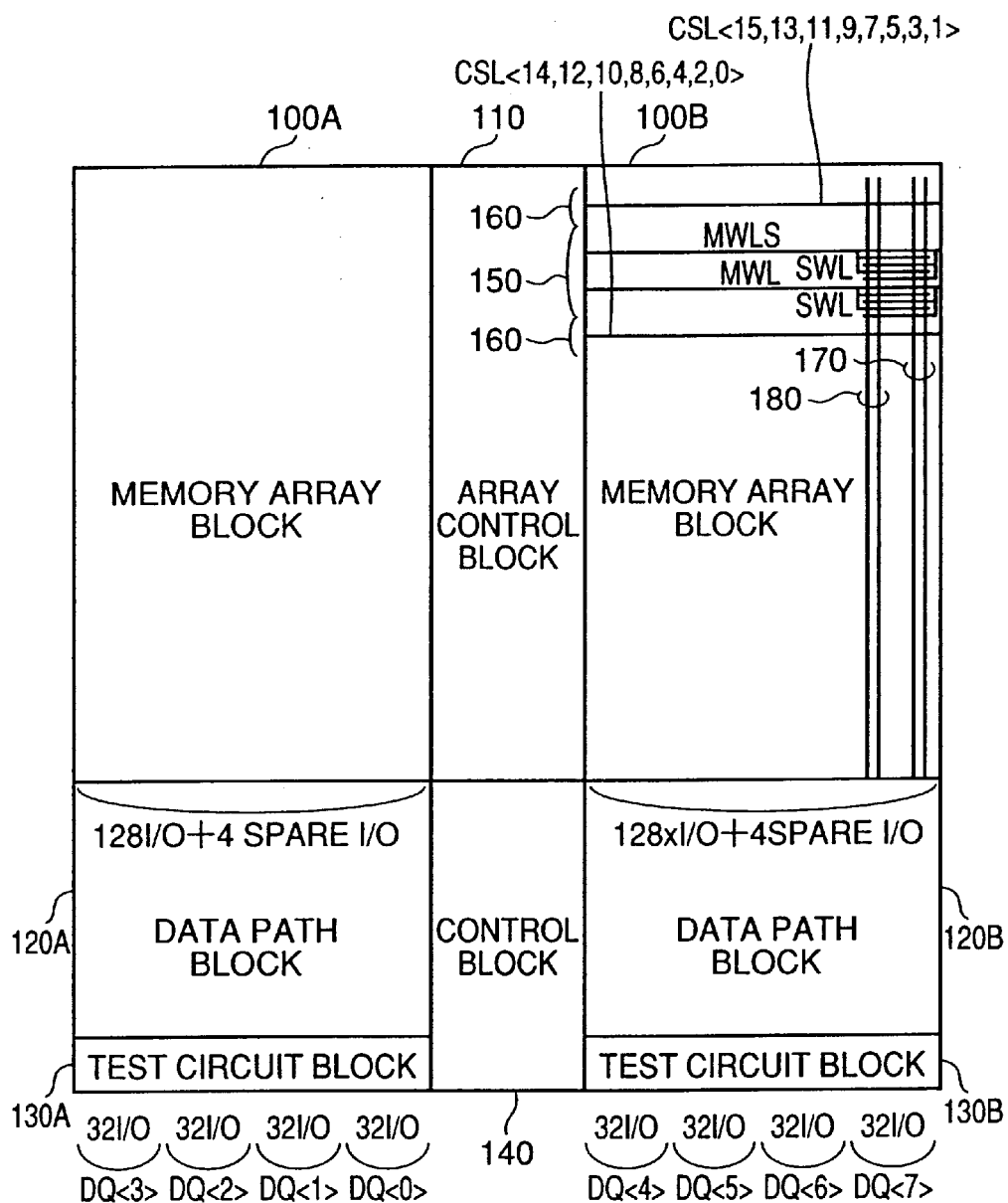
FIG. 2 is a representation showing an outline of an overall configuration of the semiconductor memory device according to a first embodiment.

The memory array blocks 100A and 100B are divided into a plurality of memory cell array regions and sense amplifier regions are arranged such that a memory cell array region is sandwiched between two sense amplifier regions. In FIG. 2, one memory cell array region 150, and sense amplifier regions 160A and 160B which are arranged such that the memory cell array region 150 is sandwiched therebetween are drawn as representatives.

A memory cell array region includes: a plurality of memory cell arranged in rows and columns, a normal main word line placed in the row direction, bit lines placed in the column direction; and a spare main word line for replacing a normal word line with a defect therewith. The normal main word line and the spare main word line each branch out into a plurality of subword lines. In the figure, among symbols, MWL indicates a normal main word line, MWLS a spare main word line, SWL a subword line.

A sense amplifier region includes: sense amplifiers each for amplifying a potential difference of a bit line pair and column select gates. The column select gates each connect a sense amplifier and a global data I/O bus pair therebetween according to a column select signal.

Read data from the memory array block 100A is transmitted to the data path block 120A via a global data I/O bus (normal or spare) while write data is transmitted to a memory cell from the data path block 120A via the global data I/O bus. Read data from the memory array block 100B is transmitted to the data path block 120B via a global data I/O bus (normal or spare) while write data is transmitted to a memory cell from the data path block 120B via the global data I/O bus.

Symbols in the figure CSL <15, 13, 11, 9, 7, 5, 3, 1> indicates respective column select signals CSL15, CSL13, CSL11, CSL9, CSL7, CSL5, CSL3, CSL1; and CSL <14, 12, 10, 8, 6, 4, 2, 0> respective column select signals CSL14, CSL12, CSL10, CSL8, CSL6, CSL4, CSL2, CSL0; a symbol 170 a normal global data I/O bus pair on the side of the memory array block 100B; and a symbol 180 a spare global data I/O bus pair on the side of the memory array block 100B.

The number of normal global data I/O bus pairs 170 is 128 pairs×2 and the number of spare global data I/O bus pairs 180 is 4 pairs×2. The number of I/O buses for data transmission in a data path block is 256 (256 I/O configuration).

One data I/O pin D/Q is assigned to each of adjacent sets of 32 I/O buses as a test output pin. Hence, 8 data I/O pins are assigned for 256 I/O buses as test output pins. Symbols DQ <0> to DQ <3> in the figure are test output pins on the side of the memory array block 100A and symbols DQ <4> to DQ <7> in the figure are test output pins on the side of the memory array block 100B.

Figure 3:
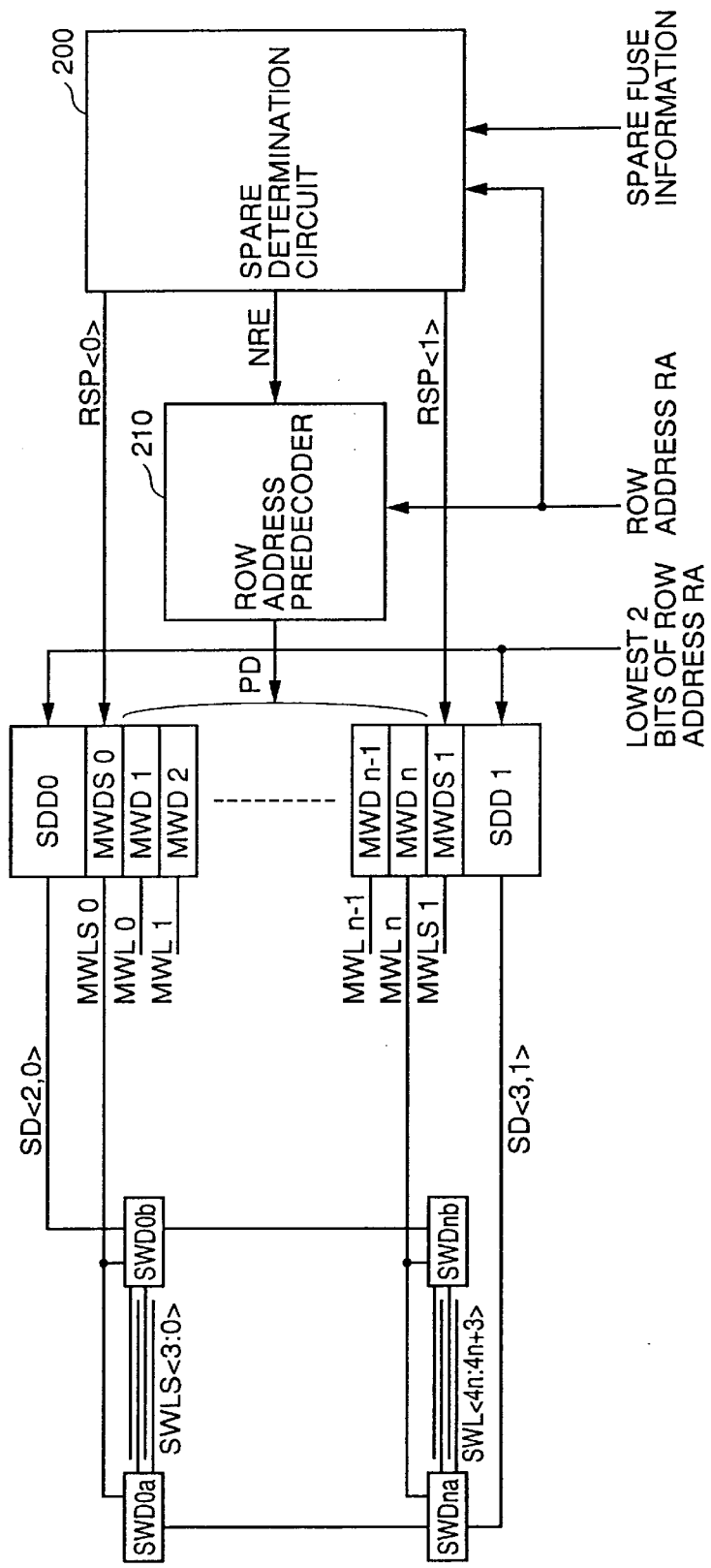
FIGS. 3 and 4 are diagrams for describing a redundancy configuration according to the first embodiment.

Description will be given of a redundancy configuration of the semiconductor memory device 1000 using FIGS. 3 and 4. Referring to FIG. 3, a symbol MWLi (i=0 to n) indicates a normal main word line and symbols MWLS0 and MWLS1 indicate spare main word lines.

The semiconductor memory device 1000 includes: a spare determination circuit 200 receiving a row address RA and spare fuse information to output signals NRE, RSP <0> and RSP <1>, which show whether or not substitution should be performed; and a row address predecoder 210 receiving the row address RA and the signal NRE to predecode the row address RA and output a predecode signal PD.

The semiconductor memory device 1000 further includes: main word drivers MWD0 to MWDn driving normal main word lines according to the predecode signal PD; a spare main word driver MWDS0 driving the spare main word line MWLS0 according to the signal RSP <0>; a spare main word driver MWDS1 driving the spare main word line MWLS1 according to the signal RSP <1>; subword drivers driving subword lines; and subdrivers SDD0 and SDD1 driving the subword drivers according to the lowest two bits of the row address RA.

The spare determination circuit 200, the row address predecoder 210, the main word drivers and others are included in the array control block 110 of FIG. 2.

The semiconductor memory device 1000 has a branched word line configuration. As a concrete example, a normal main word line MWLn branches out into subword lines SWL <4n:4n+3> (=SWL4n to 4n+3).

A subword driver SWDna selects and controls 2 subword lines among the subword lines SWL <4n:4n+3> according to a signal SD <3, 1> outputted by the subdriver SDD1. A subword driver SWDnb selects and controls the other 2 subword lines according to a signal SD <2, 0> outputted by the subdriver SDD0.

The spare main word line MWLS0 branches out into subword lines SWLS <3:0> (SWLS0 to SWLS3). The subword driver SWD0a selects and controls two subword lines among the subword lines SWLS <3:0> according to the signal SD <3, 1> outputted by the subdriver SDD1. The subword driver SWDnb selects and controls the other two subword lines according to the signal SD <2, 0> outputted by the subdriver SDD0.

When a main word line is activated, spare determination is performed. Hence, a substitution unit in the row direction is one MWL (4 SWL).

Figure 4:
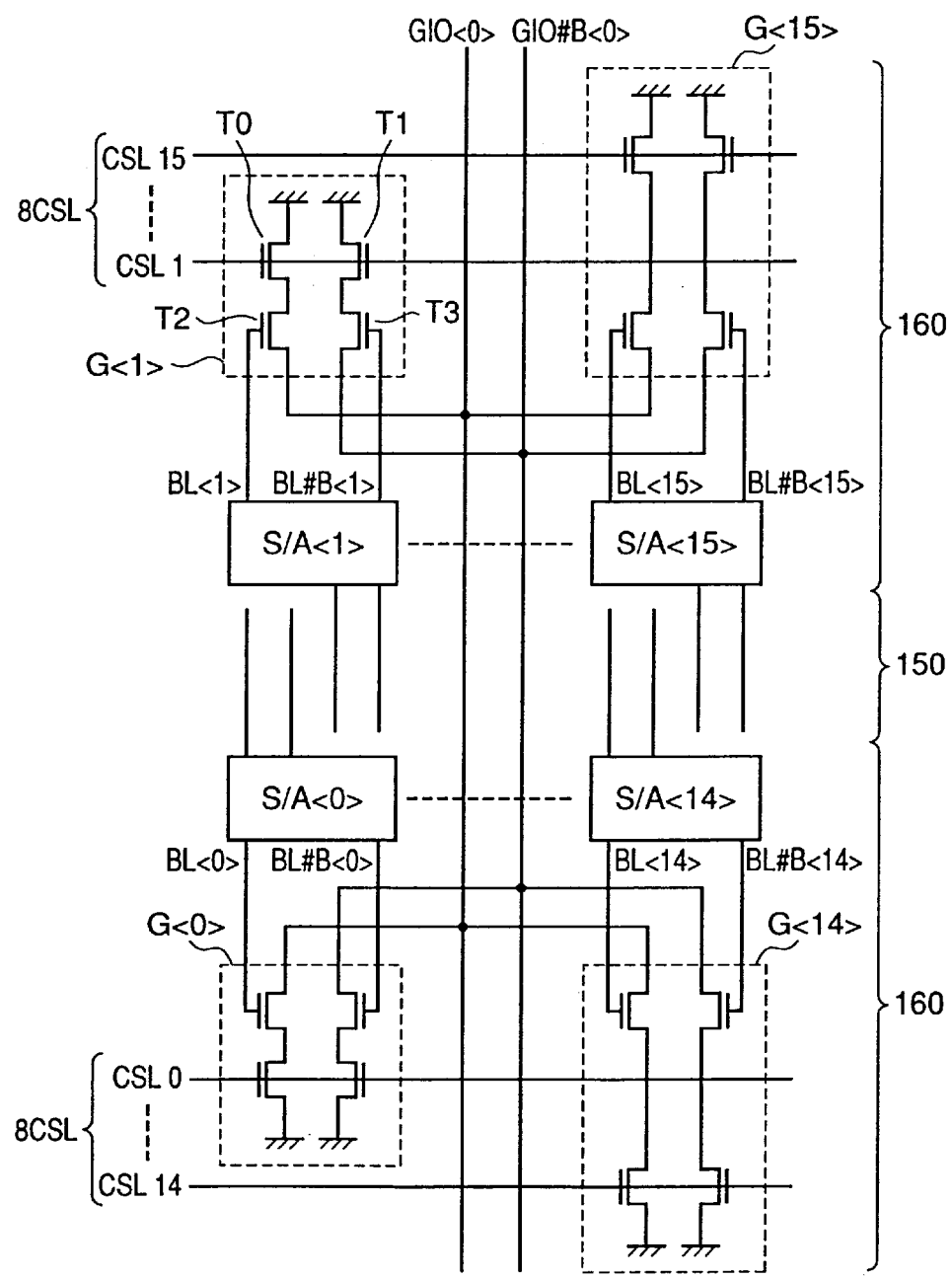

Referring to FIG. 4, a symbol CSLi indicates a column select signal or a column select signal line; symbols BL <i> and BL#B <i> a bit line pair; symbols GIO <0> and GIO#B <0> a normal global data I/O bus pair; a symbol S/A <i> a sense amplifier; and a symbol G <i> a gate (i=0 to 15).

The sense amplifier S/A <i> is coupled with the normal global data I/O bus pair GIO<0> and GIO#<0> via the gate G<i>. The gate G<i> includes: transistors T0 and T1 receiving the column select signal CSLi at the gates thereof; a transistor T2 whose gate is connected to the bit line BL <i>; and a transistor T3 whose gate is connected to the bit line BL#B <i>. The transistors T0 to T3 are NMOS transistors.

Sixteen sense amplifiers are connected to one pair of global data I/O buses. In a read operation, one column select signal line CSLi is selected and one of the 16 sense amplifiers outputs. Hence, spare substitution in the column direction is performed with a global data I/O bus pair as a unit.

Figure 5:
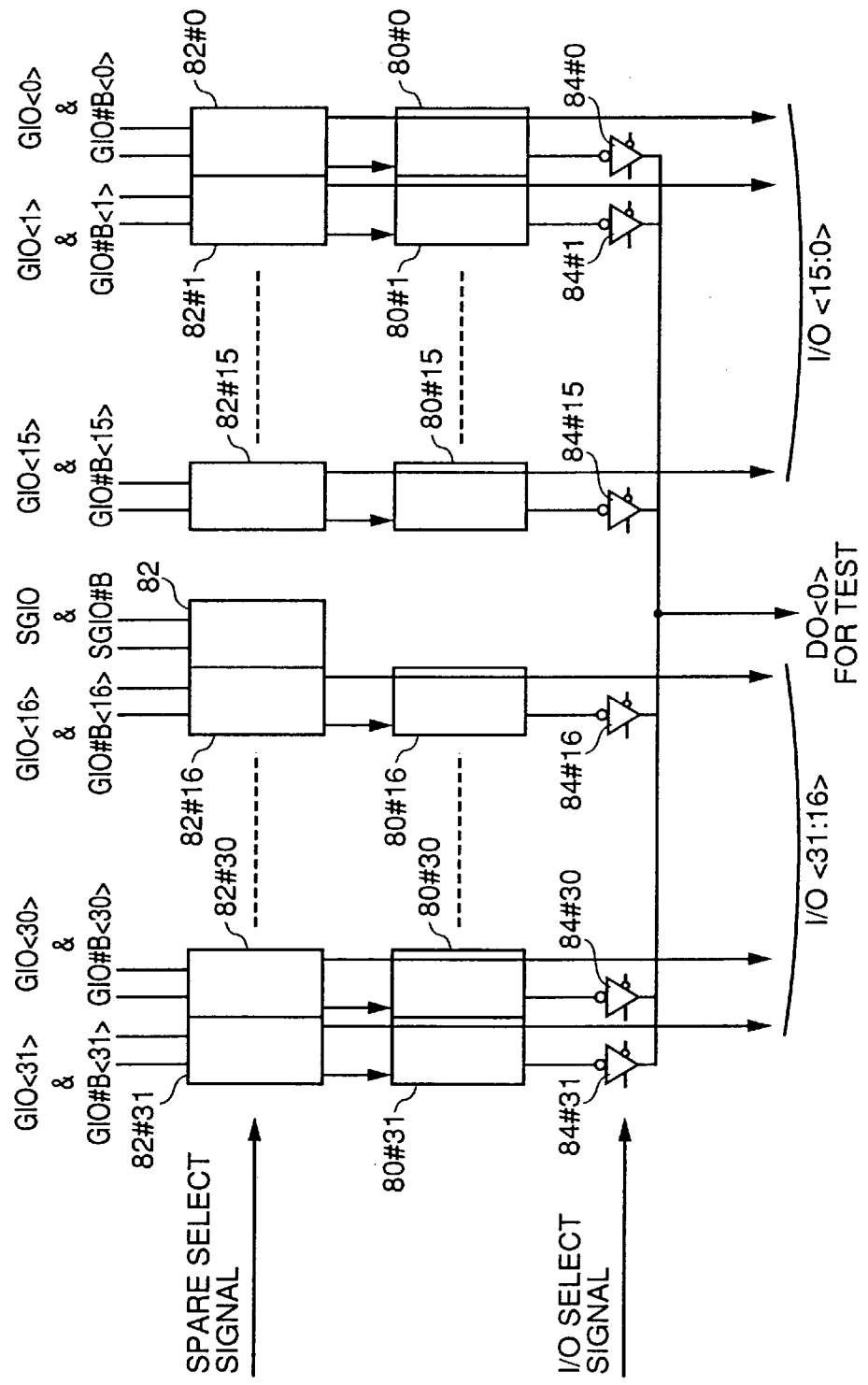
FIG. 5 is a diagram for describing a test circuit according to the first embodiment.

Next, description will be given of a test circuit block using FIG. 5. In FIG. 5, typically depicted are normal global data I/O bus pairs GIO <i> and GIO# B <i> (i=0 to 31); spare global data I/O bus pair SGIO and SGIO#B, which are provided correspondingly to the data I/O pin DQ <0>, and associated circuitry thereof.

The semiconductor memory device 1000 includes: read data paths 82#i and 82; a test circuit 80#i and a test output selector 84#i (i=0 to 31).

The read data path 82#i; the test circuit 80#i and the test output selector 84#i are provided correspondingly to the normal global data I/O bus pair GIO <i> and GIO# B <i>. The read data path 82 is provided correspondingly to one pair of the spare global data I/O buses SGIO and SGIO#B.

The read data paths 82#i and 82 perform operations such as spare substitution in response to amplification of data received via a corresponding data line pair and to a spare select signal.

In a normal read operation, as a result of spare substitution, 32 pairs among (32+1) pairs of global data I/O buses are selected. Then, read data is outputted to outside via 32 I/O buses I/O <31:16> (=I/O 16 to I/O 31) and I/O <15:0> (=I/O0 to I/O15).

The test circuit 80#i performs a test described below on data (read data) outputted by a corresponding read data path: The test output selector 84#i outputs an output of a corresponding test circuit to the data I/O pin DQ <0> according to an I/O select signal. An output node of one of the test circuits is electrically connected to the data I/O pin DQ <0>.

The semiconductor memory device 1000 includes 256/32=8 sets of the circuits shown in FIG. 5.

Figure 6:
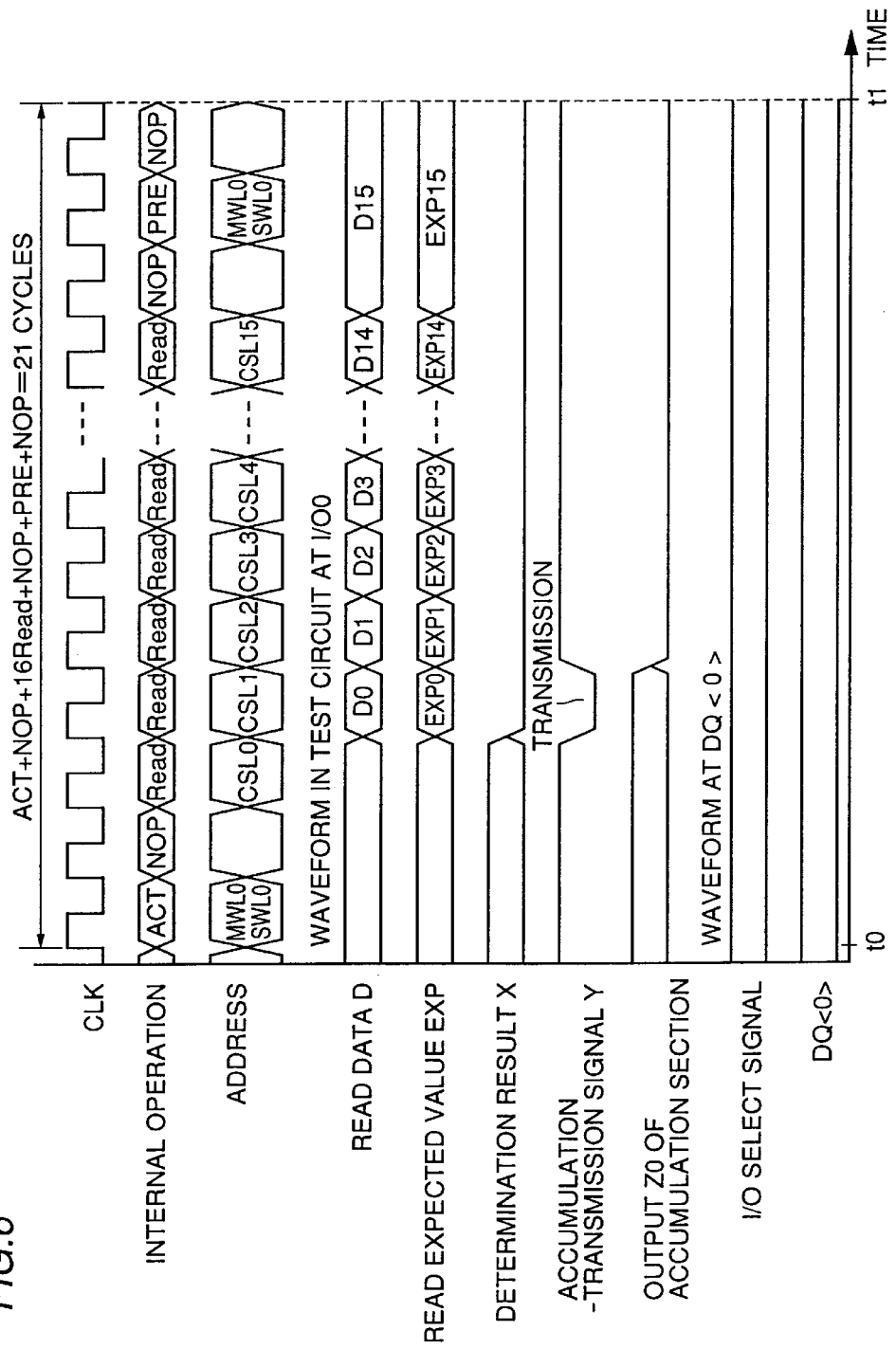
FIGS. 6 to 9 are timing charts for describing a saving test on the semiconductor memory device according to the first embodiment.
Figure 7:
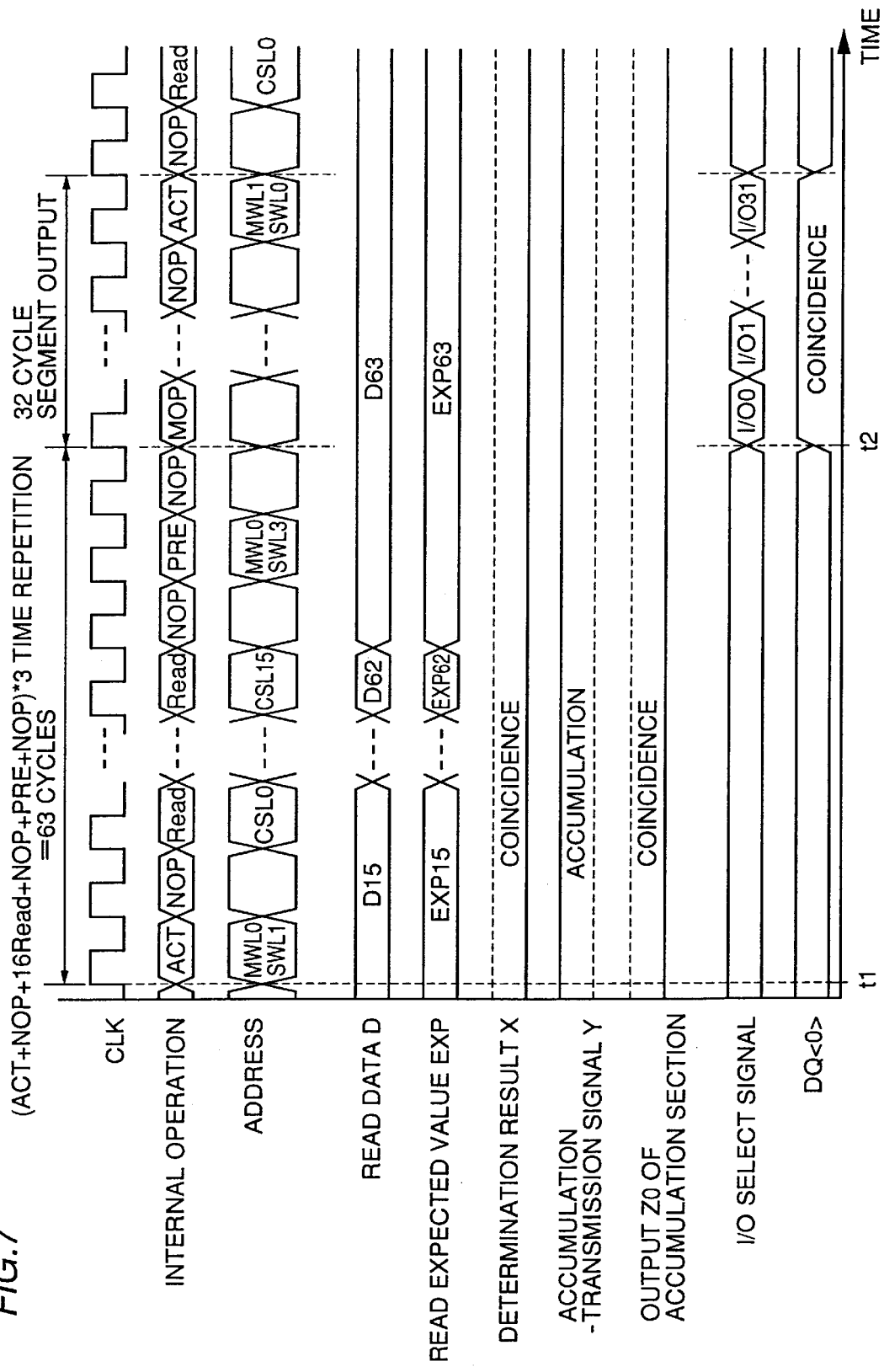

Next, description will be given of an operation in a saving test on the semiconductor memory device according to the first embodiment using FIGS. 6 and 7, and FIGS. 8 and 9. A symbol Di (i=0, 1, . . . ) represents read data from a memory cell array and EXPk (k=0, 1, . . . ) represents a read expected value. FIGS. 6 and 7 use the same abscissa representing a time scale with the same time point t1 thereon. This applies to FIGS. 8 and 9 in the same way.

The commands (ACT, NOP, Read and PRE) specifying internal operations are issued at each rise of the clock signal CLK and addresses for word line selection and column selection are inputted at the rise of the clock signal CLK on each of the issuance.

Description will be given of various signal waveforms when all of the read data are of coincidence determination using FIGS. 6 and 7. The subword line SWL0 of the main word line MWL is selected by a command ACT (t0). Subsequent to this, read commands Read are issued at respective rises of the clock signal CLK following a command NOP and thereby, column select signal lines successively enter a selected state in the order of CSL0, CSL1, . . . , CSL15.

After the column select signal line CSL15 is selected, a command PRE is issued following a command NOP inserted between the last read command Read and the command PRE. At this time point, a precharge operation is performed.

The number of cycles required for reading data on one subword line is (ACT+NOP+16 Read+NOP+PRE+NOP)= 21 cycles.

Following to this, in similar procedures, the subword lines SWL1, SWL2 and SWL3 are sequentially selected to perform data reading. If a time point when the selection of the subword line SWL3 is canceled is t2 by definition, the number of cycles between t0 and t2 is 21 cycles×4=84 cycles.

To a test circuit corresponding to the I/O bus I/O0, read data Dk and a read expected value EXPk are supplied at the time when one clock has elapsed after a column select signal CSLk is selected.

The accumulation-transmission signal Y is rendered to be at L level (a transmission state) at the time point when first read data is inputted into the determination section 10. The accumulation-transmission signal Y is rendered to be at H level at the next rise of the clock signal CLK to perform an accumulating operation.

Although the accumulation state lasts during a period while the accumulation-transmission signal Y is at H level, a determination result X is in coincidence (at L level) in a case shown in FIGS. 6 and 7. Hence, in the next cycle as well, the accumulation section 12 catches a coincidence result X. Finally, the accumulation section 12 holds a determination result X showing "all of bits being in coincidence."

After 84 cycles elapses, the I/O select signal is incremented to output 32 determination results sequentially from the test output pin DQ <0> (32 cycle segment output).

Figure 8:
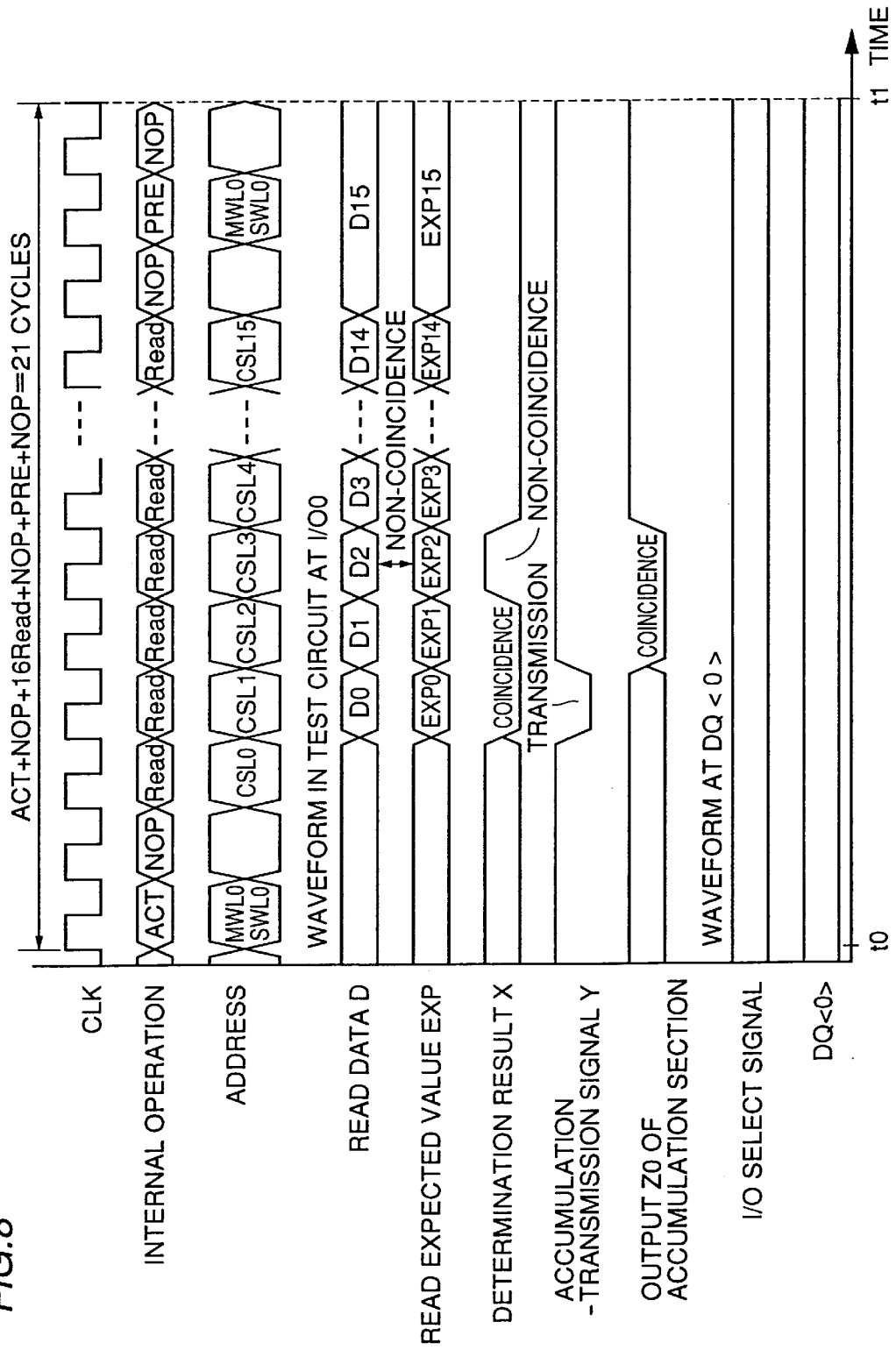
Figure 9:
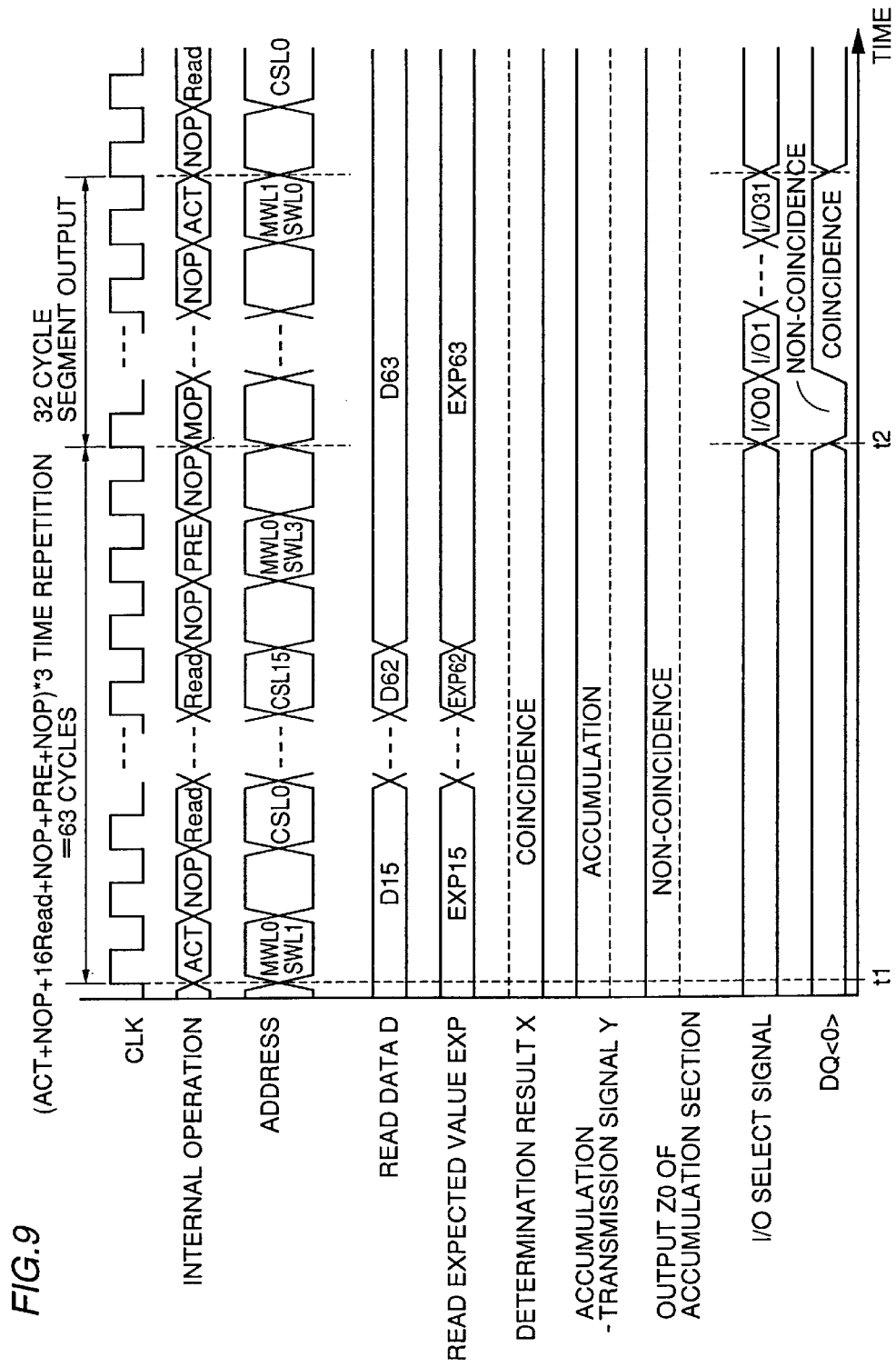

FIGS. 8 and 9 represent various signal waveforms when there arises non-coincidence of data corresponding to the I/O bus I/O0. It is assumed that non-coincidence arises between read data D2 outputted from the I/O bus I/O0 in a third cycle and a read expected value EXP2.

At first, the subword line SWL0 of the main word line MWL0 is selected by a command ACT (t0). Subsequent to this, read commands Read are issued at respective rises of the clock signal CLK following a command NOP and thereby, column select signal lines successively each enter a selected state in the order of CSL0, CSL1, . . . , CSL15.

At the time point when a first read data D0 is inputted into the determination section 10, the accumulation-transmission signal Y is rendered to be at L level (in a transmission state). Since read data D0 coincides with a read expected value EXP0, a determination result X is at L level (in coincidence).

At the next cycle, the accumulation-transmission signal Y is rendered to be at H level (in an accumulation state). Since read data D1 coincides with a read expected value EXP1, a determination result is at L level (in coincidence). In the still next cycle, since read data D2 does not coincide with a read expected value EXP2, a determination result X is at H level (in non-coincidence).

When the accumulation section 12 catches a non-coincidence result, the accumulation section 12 rejects the next determination result X since an output of the logic circuit 18 is rendered so as to stay at L level from the next clock on. Finally, a result of "at least one bit being in non-coincidence" is held.

The I/O select signal is increment after 21 cycles×4=84 cycles elapses similar to FIG. 6 and 32 determination results are sequentially outputted from the test output pin DQ <0> (32 cycle segment output).

In this way, according to the semiconductor memory device 1000 according to the first embodiment, determination of coincidence/non-coincidence becomes possible for all data in 116 cycles (=84 cycles+32 cycles). Hence, a test time for a saving test is reduced.

Second Embodiment

Description will be given of a configuration of a test circuit block in a semiconductor memory device of the second embodiment using FIG. 10. An outline of an overall configuration of the semiconductor memory device of the second embodiment is the same as that of the semiconductor memory device 1000 described in the first embodiment.

Figure 10:
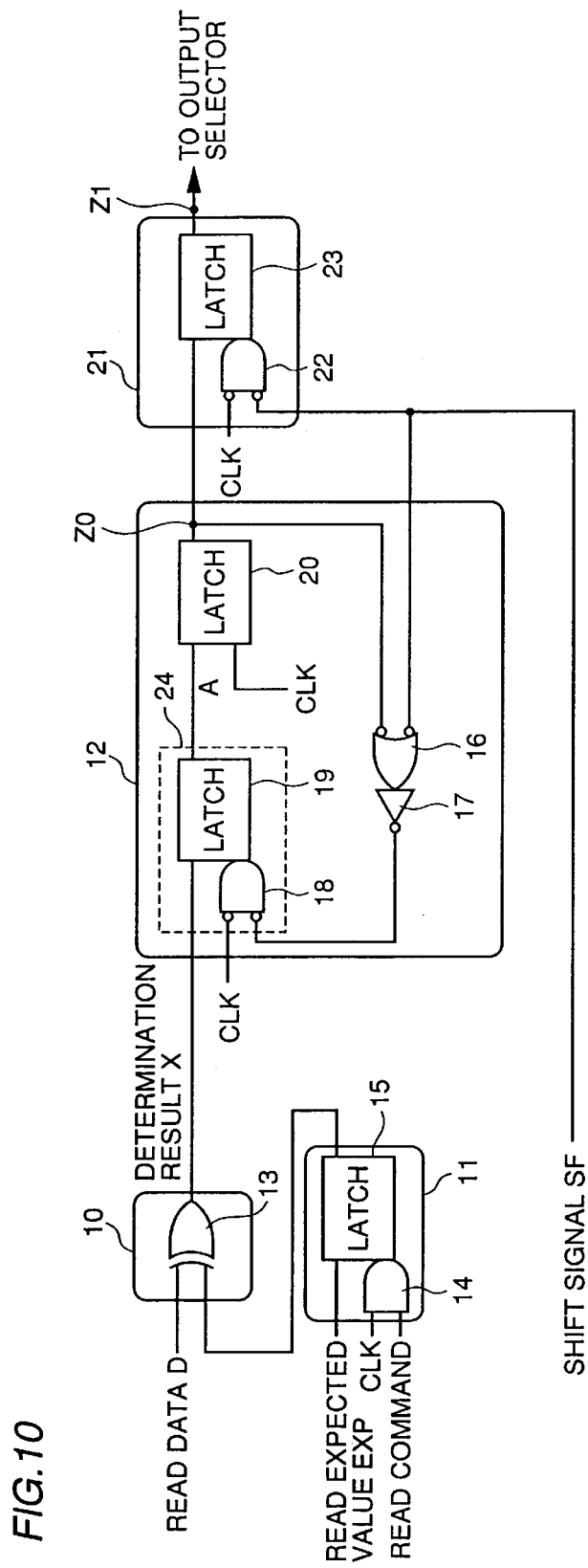
FIG. 10 is a diagram for describing a configuration of a test circuit block of a semiconductor memory device according to a second embodiment.

Referring to FIG. 10, the test circuit block according to the second embodiment includes: a determination section 10; an expected value control section 11; an accumulation section 12; and a shift section 21. The determination section 10, the accumulation section 12 and the shift section 21 are provided for each I/O bus. To be more concrete, the determination section 10, the accumulation section 12 and the shift section 21 are arranged on the above described test circuit. The expected value control section 11 can be used commonly by a plurality of test circuits.

The accumulation section 12 according to the second embodiment receives the shift signal SF instead of the accumulation-transmission signal Y.

The shift section 21 includes a latch circuit with Enable signal having a logic circuit 22 and a latch circuit 23. The logic circuit 22 receives the clock signal CLK and the shift signal SF, and outputs a signal of H level when the shift signal SF goes to L level while the clock signal CLK is at L level. When an output of the logic circuit 22 is at H level, the latch circuit 23 transmits an output signal Z0 of the accumulation section 12 therethrough, while when the output of the logic circuit 22 is at L level, latching an internal data.

As an example concrete configuration of the shift section 21, a circuit shown in FIG. 23 (a latch circuit with Enable signal 24) is taken up. A signal Z1 of an output node Z1 of the latch circuit 23 is transmitted to a corresponding test output selector.

According to the second embodiment, a common signal is used for a signal controlling accumulation and transmission in the accumulation section 12, and for a single controlling the shift section 21.

When the shift signal SF is at L level (in a shift state), the accumulation section 12 catches a determination result X, while when the shift signal goes to H level (an accumulation state), the accumulation section 12 catches the next determination result in a case of coincidence determination and once the accumulation section 12 catches a non-coincidence determination result X, thereafter the accumulation section 12 continues to hold the non-coincidence determination result X.

The shift section 21 (saving circuit) transmits an output signal Z0 of the accumulation section 12 therethrough in a shift state, while holding a determination result caught at a pervious time in an accumulation state.

Figure 11:
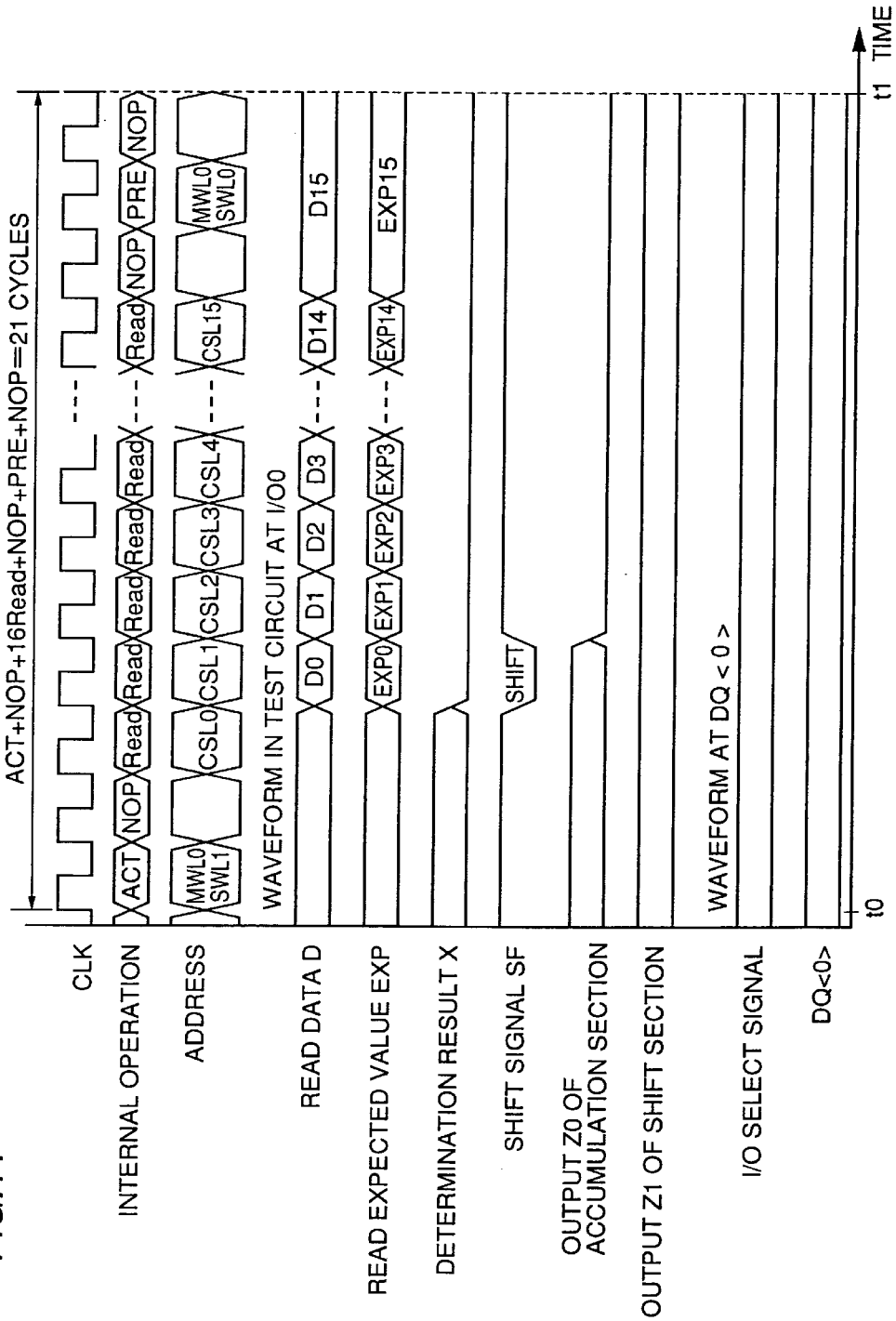
FIGS. 11 to 14 are timing charts for describing a saving test on the semiconductor memory device according to the second embodiment.
Figure 12:
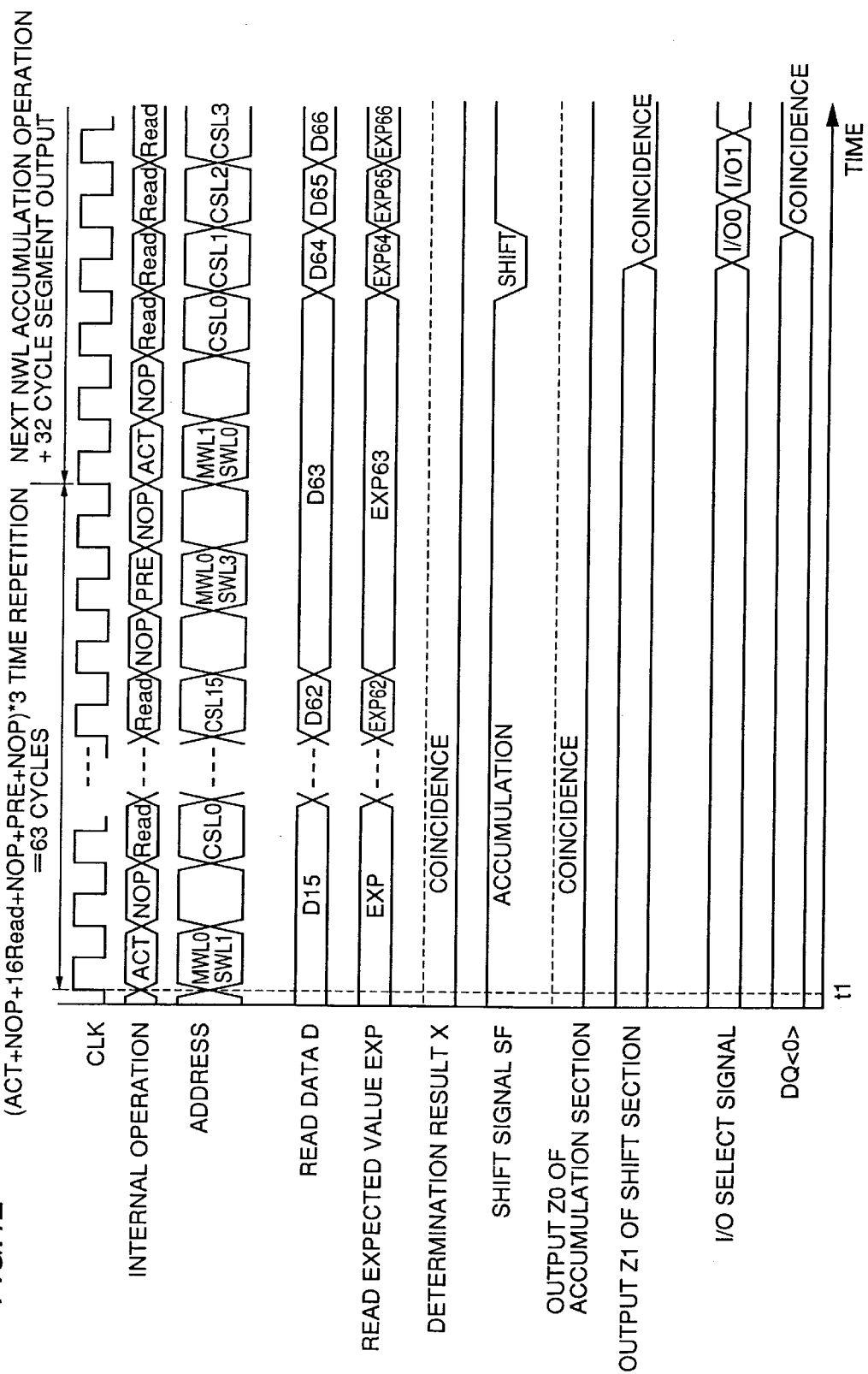

Next, description will be given of an operation in a saving test according to the second embodiment using FIGS. 11 and 12, and FIGS. 13 and 14. Note that procedures of selection of a word line and selection of a column select signal line according to the second embodiment are the same as those according to the first embodiment. FIGS. 11 and 12 use the same abscissa representing a time scale with the same time point t1 thereon. This applies to FIGS. 13 and 14 in the same way.

Description will be given of various signal waveforms when all of the read data are of coincidence determination. According to the above described procedure, data is read out from memory cells connected to the subword lines SWL0 to SWL3 of the main word line MWL0. The number of cycles for addressing on 4 subword lines is 84 cycles (=(ACT+NOP+16Read+NOP+PRE+NOP)×4).

To a test circuit corresponding to the I/O bus I/O0, supplied a read data Dk and a read expected value EXPk at the time point when one clock elapses after a column select signal CSLk is selected.

The shift signal SF is rendered to L level (a shift state) at the time point when first read data D0 is inputted into the determination section 10. The shift signal SF is rendered to H level at the next rise of the clock signal CLK to perform an accumulating operation.

Although an accumulation state lasts during a period while the shift signal SF is at H level, a determination result X is in coincidence (at L level) in a case shown in FIGS. 11 and 12. For this reason, the accumulation section 12 catches a determination result in the next cycle.

In a determining operation for the next main word line, by rendering the shift signal to L level, a determination result of "all of bits being in coincidence" is provided to the shift section 21 from the accumulation section 12. Thereafter, the shift signal SF is rendered to be at H level. After the determination result is provided to the shift section 21, data determination for the next main word line can be performed in an accumulation state.

Figure 13:
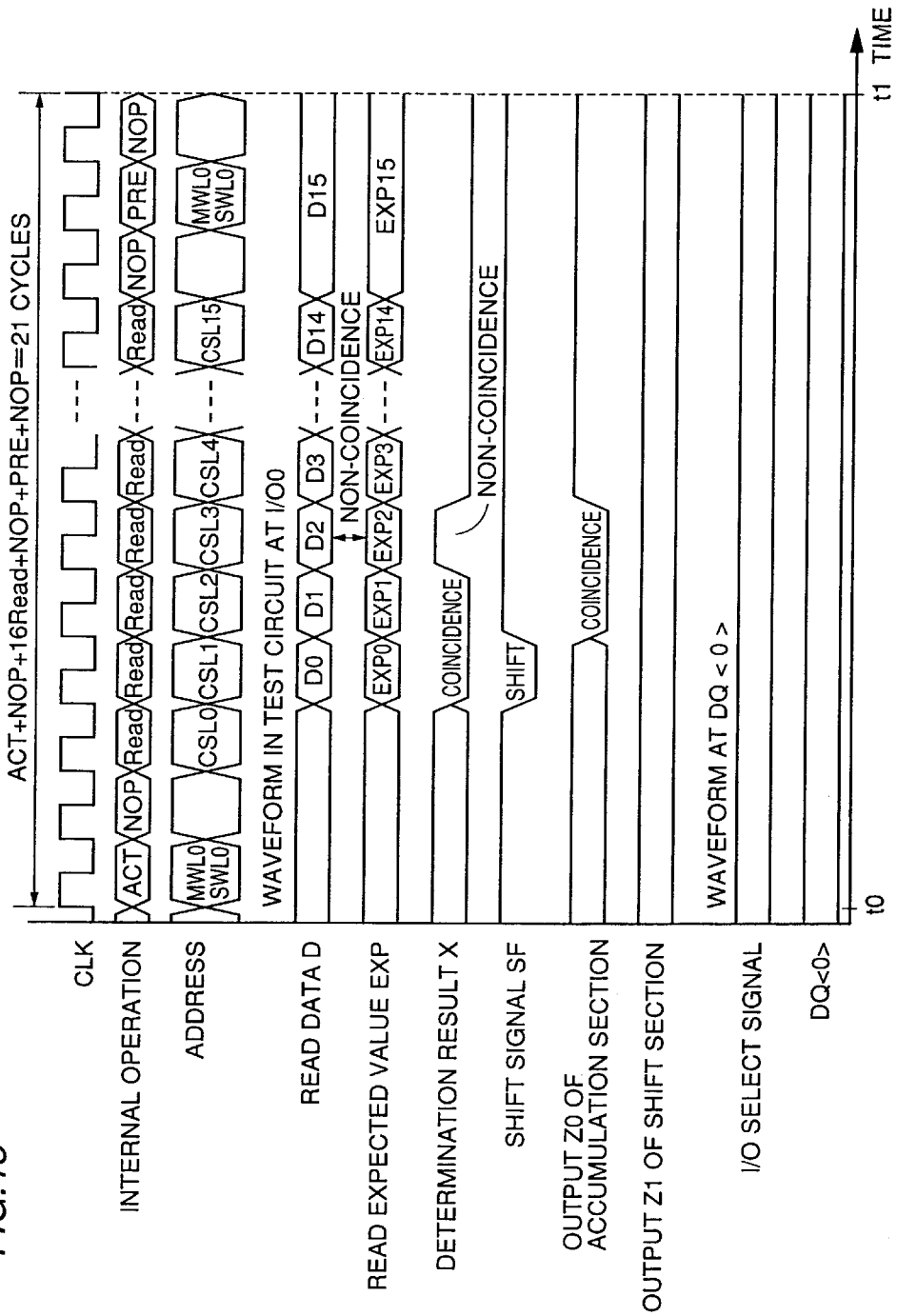
Figure 14:
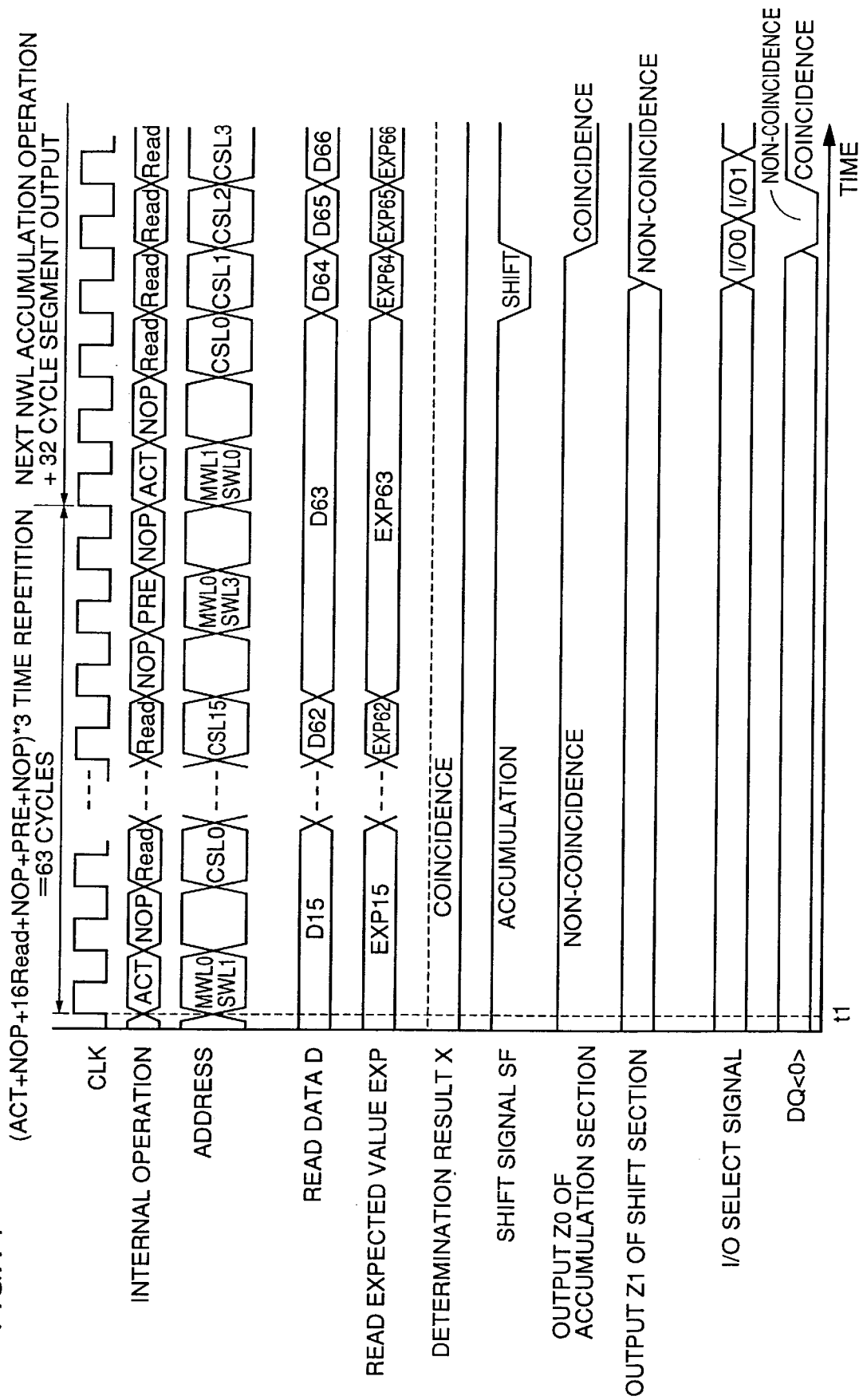

FIGS. 13 and 14 shows various signal waveforms when non-coincidence of data corresponding to the I/O bus I/O0 arises. It is assumed that read data D2 outputted from the I/O bus I/O0 does not coincide with a read expected value EXP2 in a third cycle.

The shift signal SF is at L level (in a shift state) in a first cycle in which first read data D0 is inputted into the determination section 10. Since the read data D0 coincides with the read expected value EXP0, a determination result is at L level.

In the next cycle, the shift signal SF is rendered to be at H level (in an accumulation state). Since the read data D1 coincides with the read expected value EXP1, a determination result is at L level. In the still next cycle, since the read data D2 does not coincide with the read expected value EXP2, a determination result X assumes H level (non-coincidence).

After the accumulation section 12 receives a non-coincidence determination result X, a determination result (Z0) showing non-coincidence is held, independent of an output of the determination section 10.

In a determining operation for the next main word line, by rendering the shift signal to be at L level, the determination result Z0 of "at least one bit being in non-coincidence" is provided to the shift section 21 from the accumulation section 12. Thereafter, the shift signal SF is rendered to be at H level.

After a determination result is provided to the shift section 21, data determination for the still next main word line can be performed in an accumulation state.

By arranging the shift section in such a way, an accumulating operation of 64 cycles and a 32 cycle segment output operation can be perform in parallel. As a result, output operation cycles and accumulating operation cycles can be superimposed on each other.

Therefore, according to the semiconductor memory device according the second embodiment, determination of coincidence/non-coincidence can be performed for all data data in (ACT+NOP+16Read+NOP+PRE+NOP)×4=84 cycles. Hence, a test time in a saving test can be reduced.

Third Embodiment

Description will be given of a configuration of a test circuit block in a semiconductor memory device according to the third embodiment using FIG. 15. An outline of an overall configuration of the semiconductor memory device according to the third embodiment is the same as that of the semiconductor memory device described in the first embodiment.

Figure 15:
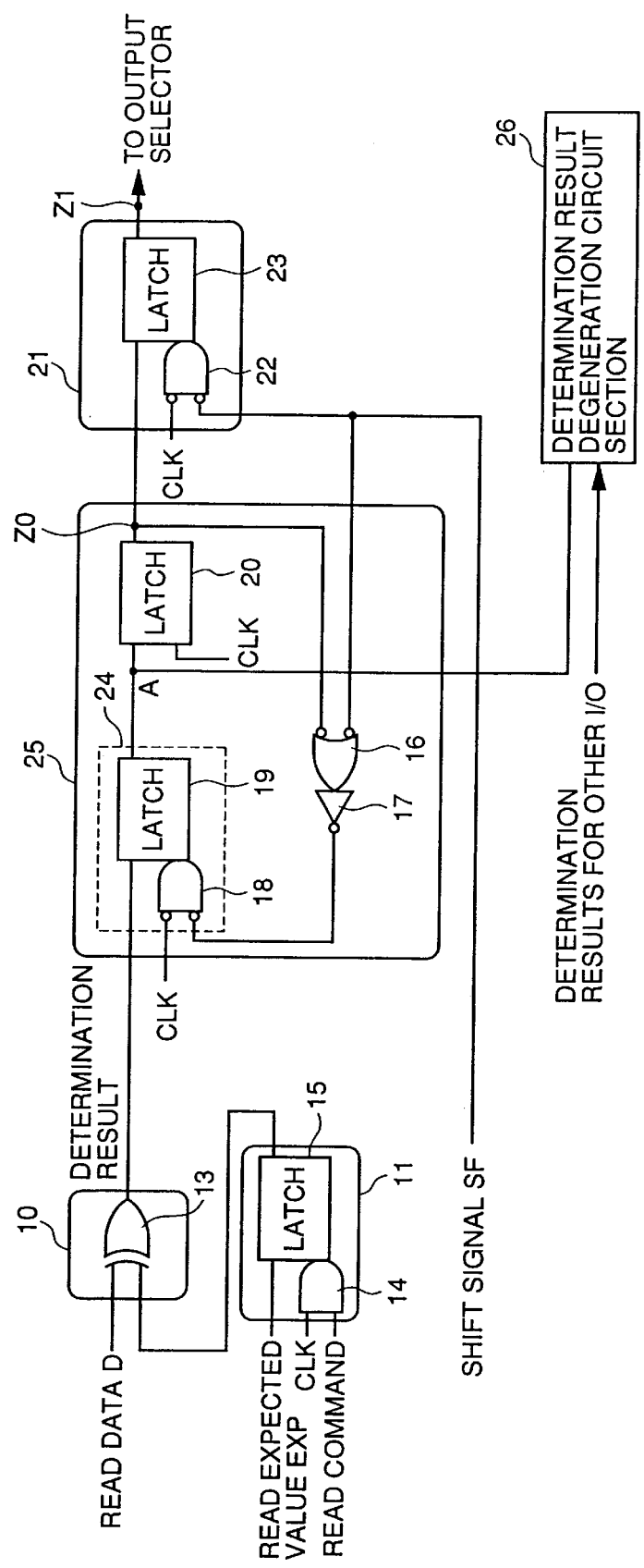
FIG. 15 is a diagram for describing a configuration of a test circuit block of a semiconductor memory device according to a third embodiment.

Referring to FIG. 15, the test circuit block according to the third embodiment includes: a determination section 10; an expected value control section 11; an accumulation section 25; a shift section 21; and a determination result degeneration circuit section 26. The determination section 10, the accumulation section 25 and the shift section 21 are provided to each I/O bus. To be more concrete, there exists at least one test circuit including the determination section 10, the accumulation section 25 and the shift section 21. The determination result degeneration circuit section 26 compiles and holds determination results for a plurality of I/O buses.

Note that the expected value control section 11 can be used commonly by a plurality of test circuits.

The accumulation section 25 according to the third embodiment includes, similar to the accumulation section 12 according to the second embodiment: a logic circuit 16 receiving a signal Z0 of an output node Z0 and the shift signal SF; an inverter 17 inverting an output of the logic circuit 16; a latch circuit with Enable signal 24; and a latch circuit 20 latching an output of the latch circuit with Enable signal 24.

In the third embodiment, in the accumulation 25, an output A of the determination result degeneration circuit section 26 is provided to a connection node A between the latch circuit with Enable signal 24 and the latch circuit 20.

The determination result degeneration circuit section 26 is a circuit compiling determination results obtained by determining data on other I/O buses. The determination result degeneration circuit section 26 outputs a non-coincidence determination result (H level) if at least one bit of a coincidence/non-coincidence determination result on other I/O buses is in non-coincidence (a determination result is at H level). In this case, the node A is driven to H level.

The determination result degeneration circuit section 26 may have any of the following configurations: a configuration compiling determination results held by a plurality of accumulation sections 12; and a configuration compiling determination results held by a plurality of shift sections 21.

Furthermore, while in the above described example, a test result of the determination result degeneration circuit section 26 is inputted between the latch circuit with Enable signal 24 and the latch circuit 20, there is no limitation to this case as an input node. Any node in the accumulation section or the shift section may be used as the input node as far as being a node in which determination results are accumulated.

In such a way, according to the semiconductor memory device according to the third embodiment, by performing a functional test for all of a memory space in an accumulation state, determination of coincidence/non-coincidence can be performed at a time at a chip level.

To be more concrete, according to the third embodiment, by adopting a chip configuration combining the determination result degeneration circuit section and the accumulation section, all of determination results are not necessary to be sequentially read out; therefore, a reduced test time can be realized even when functional tests is performed for a plurality of memories in parallel. Furthermore, a similar effect can be enjoyed in a case where a plurality of memories are implemented on a chip corresponding to a BIST (Built-In Self Test) scheme on which an automatic test circuit BIST is mounted.

Furthermore, even when a test is performed using a low speed tester for a chip mounted with a PLL or the like, a chip has to output only a final determination result with the above described configuration adopted; therefore, a reduced test time can be realized.

Fourth Embodiment

Description will be given of a configuration of a test circuit block of a semiconductor memory device according to the fourth embodiment using FIG. 16. An outline of an overall configuration of the semiconductor memory device according to the fourth embodiment is the same as that of the semiconductor memory device described in the first embodiment.

Figure 16:
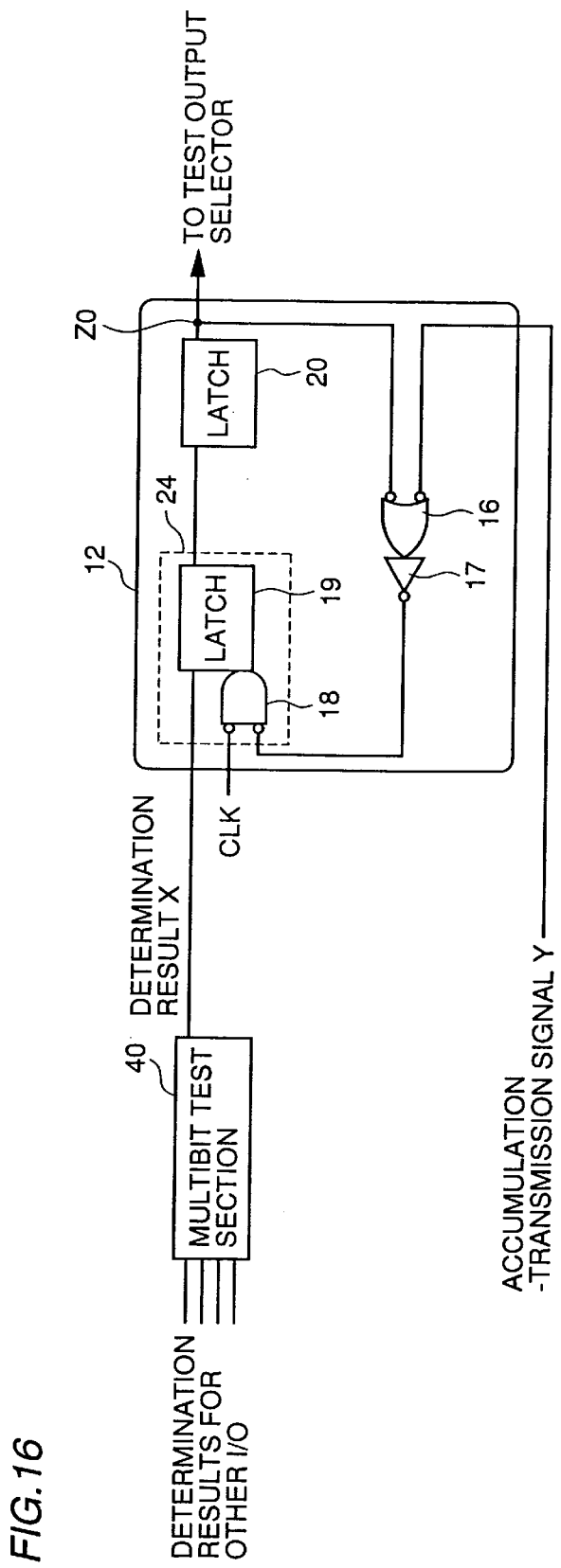
FIG. 16 is a diagram for describing a configuration of a test circuit block of a semiconductor memory device according to a fourth embodiment.

Referring to FIG. 16, the test circuit block according to the fourth embodiment includes: an accumulation section 12; and a multibit test section 40.

The multibit test section 40 read out data from memory cells on which the same data is written and determines whether or not read data coincide with each other. When at least one bit is in non-coincidence, the multibit test section 40 outputs a non-coincidence determination result X (H level) to the accumulation section 12, while when all of bits are in coincidence, outputting a coincidence result X (L level) to the accumulation section 12.

The accumulation section 12, as described above, includes: a logic circuit 16; an inverter 17 inverting an output of the logic circuit 16; a latch circuit with Enable signal 24 having a logic circuit 18 and a latch circuit 19 therein; and a latch circuit 20. To the accumulation section 12, inputted are a determination result X outputted from the multibit test section 40 and the accumulation-transmission signal Y.

When the accumulation-transmission signal Y is at L level (a transmission state), the accumulation section 12 catches an output X of the multibit test section 40, while when the accumulation-transmission signal Y goes to H level (an accumulation state), the accumulation section 12 catches the next determination result X in a case of coincidence determination and once the accumulation section 12 catches a non-coincidence determination result X, thereafter the accumulation section 12 continues to hold the non-coincidence determination result X.

Hence, According to the semiconductor memory device according to the fourth embodiment, an effect similar to the third embodiment is obtained in a functional test.

Fifth Embodiment

Description will be given of a configuration of a test circuit block in a semiconductor memory device according to the fifth embodiment using FIG. 17. Note that an outline of an overall configuration of the semiconductor memory device according to the fifth embodiment is the same that of the semiconductor memory device described in the first embodiment.

Figure 17:
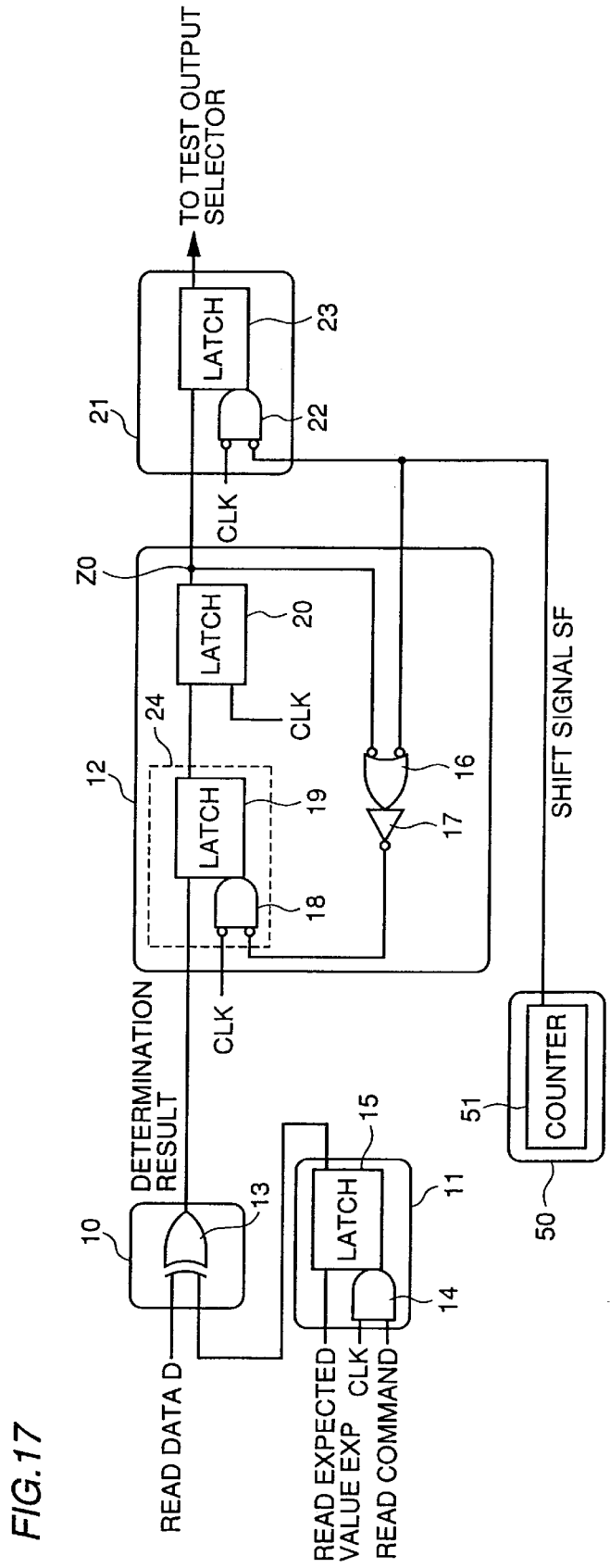
FIG. 17 is a diagram for describing a configuration of a test circuit block of a semiconductor memory device according to a fifth embodiment.

Referring to FIG. 17, the test circuit block according to the fifth embodiment includes: a determination section 10; an expected value control section 11; an accumulation section 12; a shift section 21 and a shift signal generation section 50. The determination section 10, the accumulation section 12 and the shift section 21 are provided to each I/O bus. To be more concrete, the determination section 10, the accumulation section 12 and the shift section 21 are arranged on the above described test circuit. The expected value control section 11 can be used commonly by a plurality of test circuits.

The shift signal generation section 50 includes a counter 51. The counter 51 outputs a count value as a shift signal SF. The accumulation section 12 receives a determination result X of the determination section 10 and a shift signal SF outputted by the counter 51.

When the shift signal SF is at L level (a shift state), the accumulation section 12 catches a determination result X, while when the shift signal SF goes to H level (an accumulation state), the accumulation section 12 catches the next determination result X in a case of coincidence determination, and once the accumulation section 12 catches a non-coincidence determination result X, thereafter the accumulation section 12 continues to hold the non-coincidence determination result X.

The shift section 21 transmits an output Z0 of the accumulation section 12 therethrough in a shift state, while holding a determination result caught at the previous time in an accumulation state. Note that a common signal is used for a signal controlling accumulation and transmission in the accumulation section 12 and for a single controlling the shift section 21.

Figure 18:
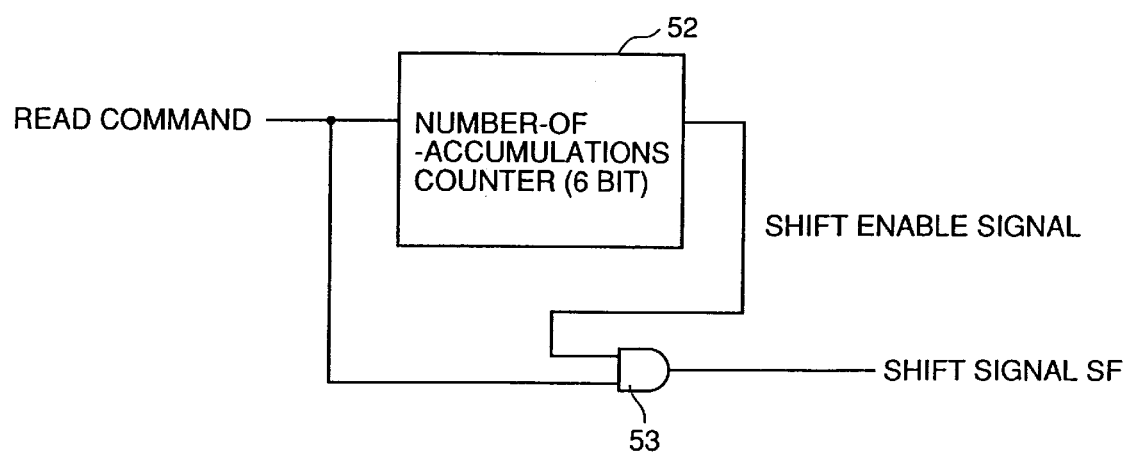
FIG. 18 is a diagram for describing a configuration of a shift signal generation circuit 50 according to the fifth embodiment.

Here, description will be given of an example concrete configuration of the shift signal generation section 50 using FIG. 18. The shift signal generation section 50 includes: a 6-bit number-of-accumulations counter 52 for accumulating 64 time inputs; and an AND circuit 53.

The number-of-accumulations counter 52 counts the number of read commands. When all of bits of the number-of-accumulations counter 52 assumes "0," the shift enable signal SE is outputted. Then, when the next read command is issued, the shift signal SF of H level is outputted from the AND circuit 53.

Note that an operation of the semiconductor memory device according to the fifth embodiment is as described in the second embodiment.

Therefore, according to the semiconductor memory device according to the fifth embodiment, a shift signal SF can be controlled based on a read command.

Sixth Embodiment

Description will be given of a configuration of a test circuit block in the semiconductor memory device according to the sixth embodiment using FIG. 19. Note that an outline of an overall configuration of the semiconductor memory device according to the sixth embodiment is the same as that of the semiconductor memory device described in the first embodiment.

Figure 19:
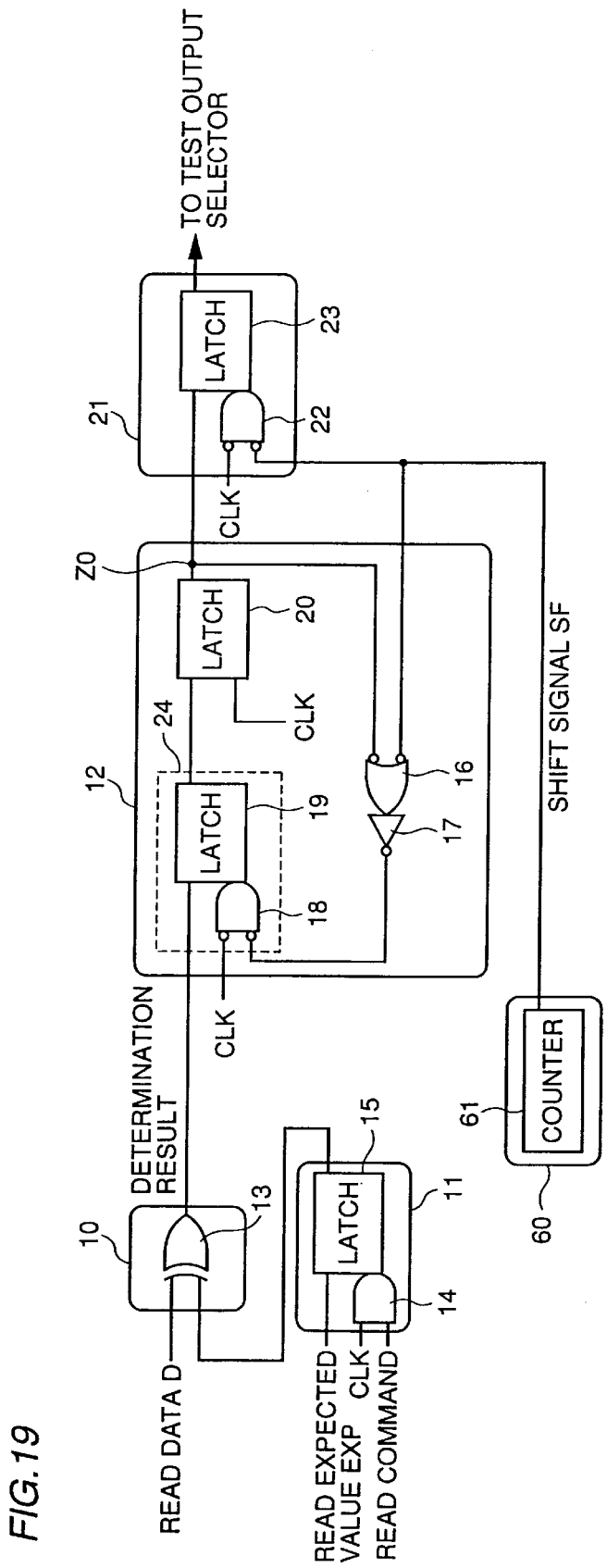
FIG. 19 is a diagram for describing a configuration of a test circuit block of a semiconductor memory device according to a sixth embodiment.

Referring to FIG. 19, the test circuit block according to the sixth embodiment includes: a determination section 10; an expected value control section 11; an accumulation section 12; a shift section 21 and a shift signal generation section 60. The determination section 10, the accumulation section 12 and the shift section 21 are provided to each I/O bus. To be more concrete, the determination section 10, the accumulation section 12 and the shift section 21 are arranged on the above described test circuit. The expected value control section 11 can be used commonly by a plurality of test circuits.

The shift signal generation section 60 includes a counter 61. The counter 61 outputs a count value as the shift signal SF.

The accumulation section 12 receives a determination result X of the determination section 10 and the shift signal outputted by the counter 61. When the shift signal SF is at L level (a shift state), the accumulation section 12 catches a determination result X, while when the shift signal SF goes to H level (an accumulation state), the accumulation section 12 catches the next determination result X in a case of coincidence determination, and once the accumulation section 12 catches a non-coincidence determination result X, thereafter the accumulation section 12 continues to hold the non-coincidence determination result X.

The shift section 21 catches an output Z0 of the accumulation section 12 in a shift state, while holding a determination result caught at the previous time in an accumulation state. Note that a common signal is used for a signal controlling accumulation and transmission in the accumulation section 12 and for a signal controlling the shift section 21.

Figure 20:
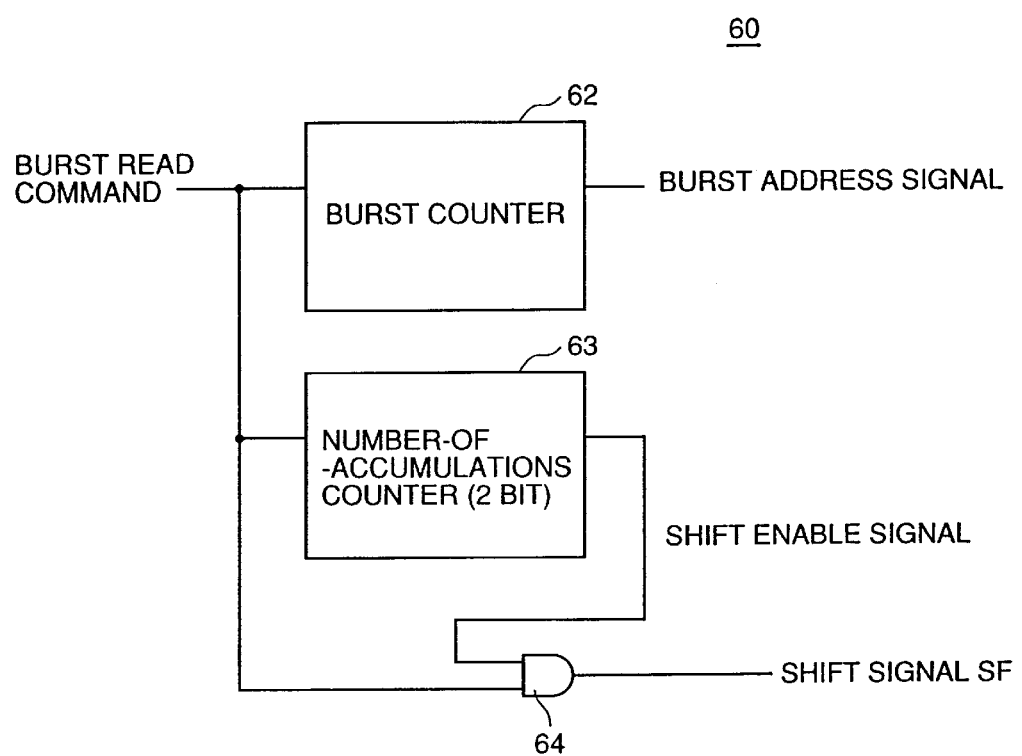
FIG. 20 is a diagram for describing a configuration of a shift signal generation circuit 60 according to the sixth embodiment.

Here, description will be given of an example concrete configuration of the shift signal generation section 60 using FIG. 20. In FIG. 20, shown is an example in which a burst counter 62 is used as a part of the shift signal generation section 60. It is assumed that a burst length BL is 16. When a burst read command is issued, the burst counter 62 starts a count operation and outputs a burst address signal. Thereby, a read operation for a burst length BL=16 is performed.

A 2-bit number-of-accumulations counter 63 counts times of burst read commands. When all of bits of the number-of-accumulations 63 assume "0," the shift enable signal SE of H level is issued. Then when the next read command is issued, the shift signal SF of H level is outputted from the AND circuit 64.

Hence, according to the semiconductor memory device according to the sixth embodiment, the shift signal SF can be controlled using a burst counter.

Note that while in the above description, a burst counter is described as an example, there is no limitation to this. An counter available on the market used in the semiconductor memory device (for example, a refresh counter) can be used as part of the shift signal generation section.

Seventh Embodiment

Figure 21:
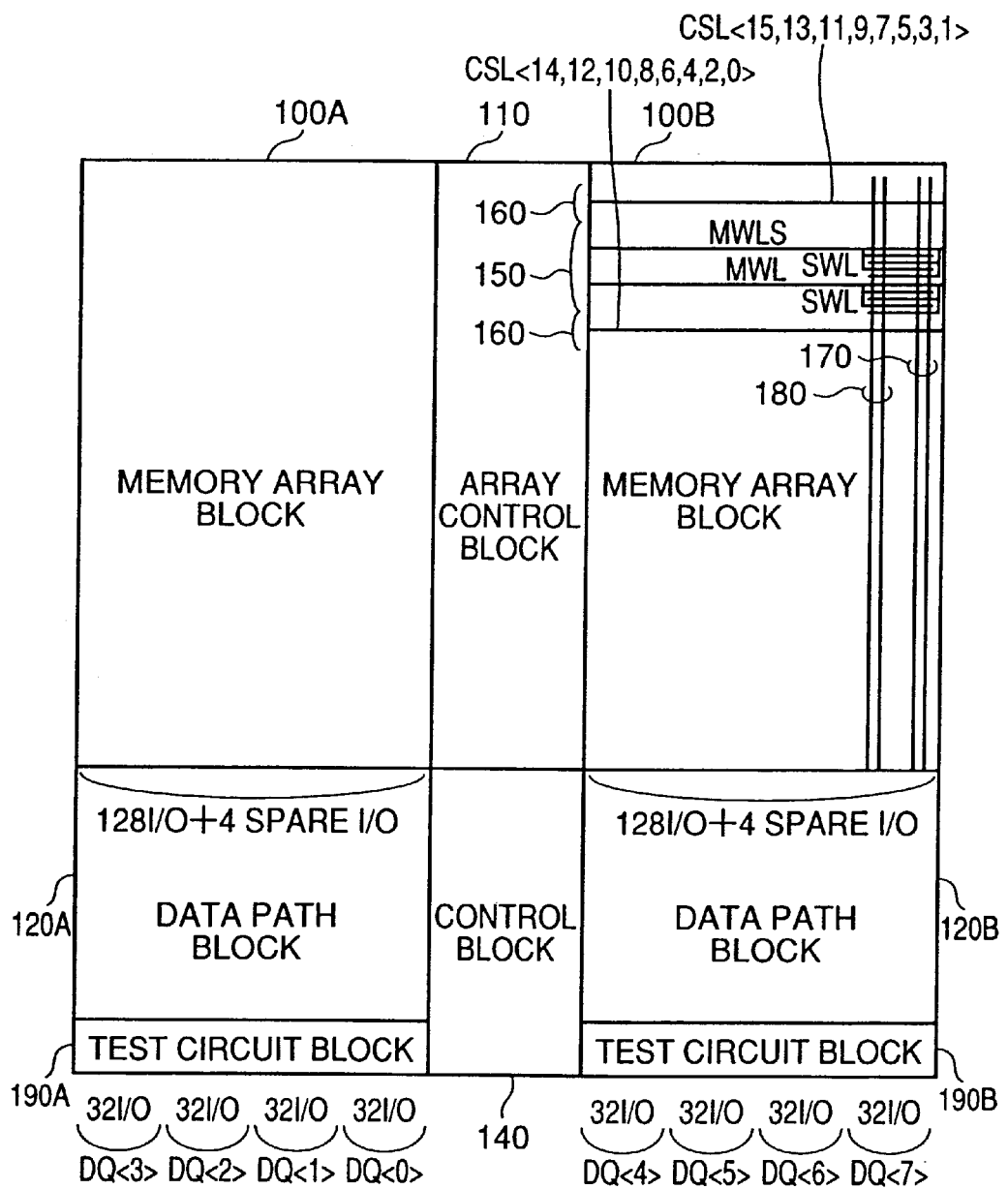
FIG. 21 is a representation showing an outline of an overall configuration of a semiconductor memory device according to a seventh embodiment.

Description will be given of an overall configuration of a semiconductor memory device according to the seventh embodiment using FIG. 21. The semiconductor memory device shown in FIG. 21 includes: test circuit blocks 190A and 190B instead of the test circuit blocks 130A and 130B.

Figure 22:
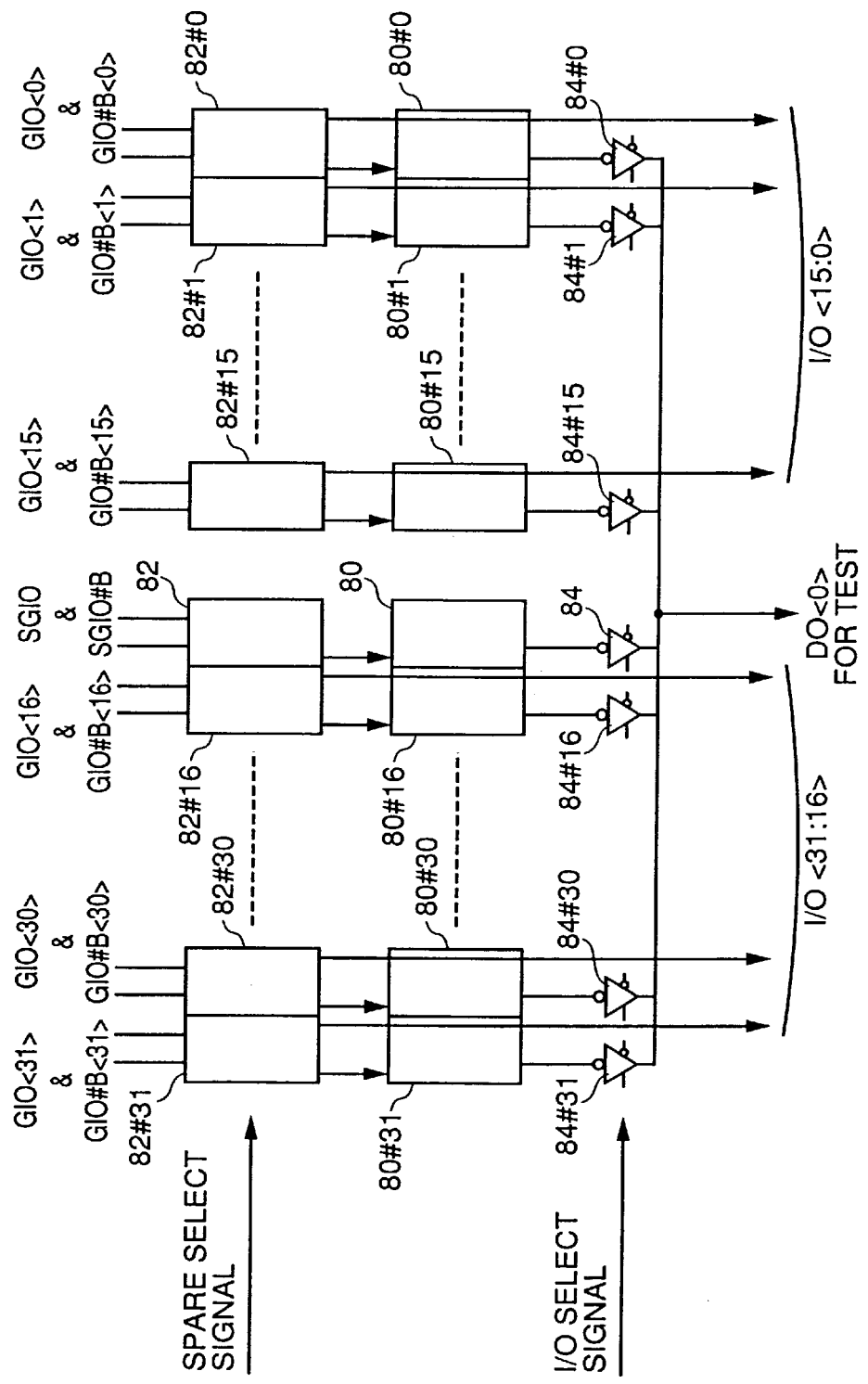
FIG. 22 is a diagram for describing a configuration of a test circuit block of the semiconductor memory device according to a seventh embodiment.

Description will be given of an outline of the test circuit block according to the seventh embodiment. In the seventh embodiment, as shown in FIG. 22, a test circuit 80 is provided to a spare global data I/O buses SGIO and SGIO#B as well. To be concrete, the test circuit 80 receives read data corresponding to spare, amplified by the read data path 82. A configuration of the test circuit 80 is the same as the test circuits 80#0 to 80#31 and is as described in the first to sixth embodiments.

An output of the test circuit 80 is inputted to a test output selector 84. Test output selectors 84#0 to 84#31 and 84 receive an I/O select signal and one of the selectors is selectively connected to the test data I/O pin DQ <0>.

Note that though not shown in the figure, in the seventh embodiment, 256/32=8 sets of circuits one set of which is shown in FIG. 22 are included.

In such a way, according to the seventh embodiment, similar to the first to sixth embodiments, a test time can be reduced even in a spare test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test facilitating circuit comprising: a non-coincidence holding circuit configured for receiving a determination result showing coincidence/non-coincidence between input data and an expected value and a control signal at an input thereof, wherein when said control signal shows a transmission state, said non-coincidence holding circuit catches said determination result, while when said control signal shows an accumulation state different from said transmission state, once said non-coincidence holding circuit catches said determination result showing said non-coincidence, thereafter said non-coincidence holding circuit holds said determination result showing said non-coincidence till said control signal shows said transmission state.

2. The test facilitating circuit according to claim 1, comprising:
a plurality of said non-coincidence holding circuits, and further comprising:
a plurality of comparators each for determining coincidence/non-coincidence between input data and an expected value, wherein
each of said non-coincidence holding circuits receives a determination result outputted by a corresponding comparator.

3. The test facilitating circuit according to claim 2, further comprising:
a circuit configured for outputting a non-coincidence result when at least one of first plural ones of said determination results is said non-coincidence; and
a degeneration circuit configured for outputting said non-coincidence result when said circuit outputs said non-coincidence result.

4. The test facilitating circuit according to claim 1, further comprising: a multibit test circuit configured for testing whether or not all of bits of said input data are in coincidence, wherein said non-coincidence holding circuit receives an output of said multibit test circuit as said determination result.

5. The test facilitating circuit according to claim 1, further comprising a saving circuit configured for catching said determination result outputted by said non-coincidence holding circuit when a shift signal is in a first state, while holding said determination result caught at a previous time when said shift signal is in a second state other than said first state.

6. The test facilitating circuit according to claim 5, wherein said non-coincidence holding circuit is arranged to receive said shift signal as said control signal.

7. The test facilitating circuit according to claim 5, comprising:
a plurality of said non-coincidence holding circuits; and
a plurality of said saving circuits, and
further comprising:
a circuit configured for outputting a non-coincidence result when at least one of first plural ones of said determination results is in non-coincidence; and
a degeneration circuit configured for outputting said non-coincidence result when said circuit outputs said non-coincidence circuit.

8. The test facilitating circuit according to claim 5, further comprising: a counter for generating said shift signal.

9. The test facilitating circuit according to claim 1, further comprising: a counter for generating said control signal.

10. The test facilitating circuit according to claim 1, further comprising: a circuit configured for catching said expected value in a specified operating mode only.

11. A semiconductor memory device comprising:
a memory cell array including a plurality of memory cells, a plurality of word lines, and a plurality of bit lines;
a read circuit configured for reading out data from said memory cell array; and
a test facilitating circuit including a non-coincidence holding circuit configured for receiving a determination result showing coincidence/non-coincidence between said read data and an expected value and a control signal at an input thereof, wherein when said control signal shows a transmission state, said non-coincidence holding circuit catches said determination result, while when said control signal shows an accumulation state different from said transmission state, once said non-coincidence holding circuit catches said determination result showing said non-coincidence, thereafter said non-coincidence holding circuit holds said determination result showing said non-coincidence till said control signal shows said transmission state.

12. The semiconductor memory device according to claim 11, wherein said test facilitating circuit further includes: a plurality of said non-coincidence holding circuits; and a plurality of comparators each for determining coincidence/non-coincidence between read data and an expected value, wherein each of said non-coincidence holding circuits receives a determination result outputted by a corresponding comparator.

13. The semiconductor memory device according to claim 12, wherein the test facilitating circuit further includes: a circuit configured for outputting a non-coincidence result when at least one of first plural ones of said determination results is said non-coincidence; and a degeneration circuit for outputting said non-coincidence result when said circuit outputs said non-coincidence result.

14. The semiconductor memory device according to claim 11, wherein said test facilitating circuit further includes: a multibit test circuit configured for testing whether or not all of bits of said read data are in coincidence, wherein said non-coincidence holding circuit is arranged to receive an output of said multibit test circuit as said determination result.

15. The semiconductor memory device according to claim 11, wherein when a shift signal is in a first state, said test facilitating circuit is arranged to catch said determination result outputted by said non-coincidence holding circuit, while when said shift signal in a state other than said first state, further including a saving circuit configured for holding said determination result caught at a previous time.

16. The semiconductor memory device according to claim 15, wherein said non-coincidence holding circuit receives said shift signal as said control signal.

17. The semiconductor memory device according to claim 15, wherein said test facilitating circuit includes: a plurality of said non-coincidence circuits: and a plurality of said saving circuits, and further includes: a circuit configured for outputting a non-coincidence result when at least one of first plural ones of said determination results is said non-coincidence, wherein at least one of said saving circuits outputs said non-coincidence result when said circuit outputs said non-coincidence result.

18. The semiconductor memory device according to claim 15, further comprising a counter for generating said shift signal.

19. The semiconductor memory device according to claim 18, further comprising a burst counter for performing a burst operation, wherein said burst counter is used as said counter.

20. The semiconductor memory device according to claim 18, further comprising a refresh counter for performing a refresh operation, wherein said refresh counter is used as said counter.

21. The semiconductor memory device according to claim 11, further comprising a counter for generating said control signal.

22. The semiconductor memory device according to claim 21, further comprising a burst counter for performing a burst operation, wherein said burst counter is used as said counter.

23. The semiconductor memory device according to claim 21, further comprising a refresh counter for performing a refresh operation, wherein said refresh counter is used as said counter.

24. The semiconductor memory device according to claim 11, wherein said test facilitating circuit further includes a circuit configured for catching said expected value in a specified operating mode only.

25. The semiconductor memory device according to claim 11, further comprising a redundancy circuit for saving a defect of said memory cell array; and a redundancy test facilitating circuit having the same configuration as said test facilitating circuit provided for data read out from said redundancy circuit.

* * * * *